(12) United States Patent
Jinta

(10) Patent No.: US 11,233,109 B2
(45) Date of Patent: Jan. 25, 2022

(54) DISPLAY DEVICE, METHOD OF MANUFACTURING THE SAME, AND ELECTRONIC APPARATUS

(71) Applicant: Sony Group Corporation, Tokyo (JP)

(72) Inventor: Seiichiro Jinta, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 17/235,326

(22) Filed: Apr. 20, 2021

(65) Prior Publication Data
US 2021/0249493 A1 Aug. 12, 2021

Related U.S. Application Data

(63) Continuation of application No. 16/813,361, filed on Mar. 9, 2020, now Pat. No. 11,004,924, which is a
(Continued)

(30) Foreign Application Priority Data

Sep. 12, 2013 (JP) .................................. 2013-189836
Feb. 6, 2014 (JP) .................................. 2014-021604

(51) Int. Cl.
*G09G 1/00* (2006.01)
*H01L 27/32* (2006.01)
(Continued)

(52) U.S. Cl.
CPC ....... *H01L 27/3262* (2013.01); *G09G 3/2003* (2013.01); *G09G 3/3233* (2013.01); *H01L 27/127* (2013.01); *H01L 27/1222* (2013.01); *H01L 27/1229* (2013.01); *H01L 27/1237* (2013.01); *H01L 27/1251* (2013.01); *H01L 27/3213* (2013.01); *H01L 27/3276* (2013.01); *H01L 29/495* (2013.01);
(Continued)

(58) Field of Classification Search
None
See application file for complete search history.

(56) References Cited

U.S. PATENT DOCUMENTS 6,909,240 B2   6/2005 Osame et al.
9,698,164 B2 * 7/2017 Morosawa ........ H01L 29/78696
(Continued)

FOREIGN PATENT DOCUMENTS

CN   101110422 A   1/2008
CN    1442843 A    9/2013
(Continued)

OTHER PUBLICATIONS

Japanese Office Action dated Apr. 3, 2018 for corresponding Japanese Application No. 2015-536473**.
(Continued)

*Primary Examiner* — Michael A Faragalla
(74) *Attorney, Agent, or Firm* — Michael Best & Friedrich LLP

(57) ABSTRACT

There is provided a display device including: a light emitting element; and a drive transistor (DRTr) that includes a coupling section (W1) and a plurality of channel sections (CH) coupled in series through the coupling section (W1), wherein the drive transistor (DRTr) is configured to supply a drive current to the light emitting element.

32 Claims, 34 Drawing Sheets

Related U.S. Application Data continuation of application No. 16/369,162, filed on Mar. 29, 2019, now Pat. No. 10,615,238, which is a continuation of application No. 16/296,612, filed on Mar. 8, 2019, now Pat. No. 10,615,237, which is a continuation of application No. 16/181,838, filed on Nov. 6, 2018, now Pat. No. 10,312,314, which is a continuation of application No. 16/014,753, filed on Jun. 21, 2018, now Pat. No. 10,147,779, which is a continuation of application No. 15/965,153, filed on Apr. 27, 2018, now Pat. No. 10,121,841, which is a continuation of application No. 15/813,983, filed on Nov. 15, 2017, now Pat. No. 10,026,796, which is a continuation of application No. 14/909,586, filed as application No. PCT/JP2014/068876 on Jul. 16, 2014, now Pat. No. 10,103,212.

(51) Int. Cl.
    *H01L 51/50* (2006.01)
    *H01L 29/786* (2006.01)
    *H01L 27/12* (2006.01)
    *G09G 3/3233* (2016.01)
    *G09G 3/20* (2006.01)
    *H01L 29/49* (2006.01)

(52) U.S. Cl.
    CPC .. *H01L 29/78648* (2013.01); *H01L 29/78678* (2013.01); *H01L 29/78696* (2013.01); *H01L 51/504* (2013.01); *G09G 2230/00* (2013.01); *G09G 2300/0426* (2013.01); *G09G 2300/0452* (2013.01); *G09G 2300/0809* (2013.01); *G09G 2310/08* (2013.01); *G09G 2320/02* (2013.01); *H01L 27/322* (2013.01); *H01L 29/78672* (2013.01); *H01L 2227/323* (2013.01); *H01L 2251/5315* (2013.01)

(56) References Cited

U.S. PATENT DOCUMENTS

| | | | |
|---|---|---|---|
| 9,972,670 B2* | 5/2018 | Yamazaki | G02F 1/13454 |
| 2002/0171086 A1 | 11/2002 | Miyajima et al. | |
| 2003/0062845 A1 | 4/2003 | Yamazaki et al. | |
| 2003/0222589 A1 | 4/2003 | Osame et al. | |
| 2006/0098521 A1 | 11/2006 | Shimoda et al. | |
| 2007/0287236 A1 | 12/2007 | Kim | |
| 2009/0101905 A1 | 4/2009 | Hayashi et al. | |
| 2010/0007327 A1 | 1/2010 | Andoh et al. | |
| 2010/0026612 A1 | 2/2010 | Yamamoto et al. | |
| 2011/0108846 A1 | 5/2011 | Choi et al. | |
| 2011/0134045 A1 | 6/2011 | Chan et al. | |
| 2013/0009933 A1 | 5/2013 | Nozawa | |
| 2013/0153893 A1 | 6/2013 | Morosawa et al. | |

FOREIGN PATENT DOCUMENTS

| | | |
|---|---|---|
| JP | 62-092370 A | 4/1987 |
| JP | 05-335573 | 12/1993 |
| JP | 08-250742 | 9/1996 |
| JP | 11-095259 A | 4/1999 |
| JP | 2002-175029 A | 6/2002 |
| JP | 2002-297059 A | 10/2002 |
| JP | 2002-311453 A | 10/2002 |
| JP | 2003-045892 A | 2/2003 |
| JP | 2003-058075 A | 2/2003 |
| JP | 2003-223120 A | 8/2003 |
| JP | 2003-295793 A | 10/2003 |
| JP | 2003-308030 A | 10/2003 |
| JP | 2004-047410 A | 2/2004 |
| JP | 2004-341312 A | 12/2004 |
| JP | 2005-191212 A | 7/2005 |
| JP | 2005-202371 A | 7/2005 |
| JP | 2006128938 A | 5/2006 |
| JP | 2006-091089 A | 6/2006 |
| JP | 2006270077 A | 10/2006 |
| JP | 2008-046427 A | 2/2008 |
| JP | 2008-046619 A | 2/2008 |
| JP | 2009-038368 A | 2/2009 |
| JP | 2009-049243 A | 3/2009 |
| JP | 2009-069571 A | 4/2009 |
| JP | 2009-212219 A | 9/2009 |
| JP | 2009-224595 A | 10/2009 |
| JP | 2009-302272 A | 12/2009 |
| JP | 2010-147368 A | 7/2010 |
| JP | 2010-224111 A | 10/2010 |
| JP | 2012-038855 A | 2/2012 |
| JP | 2013-130615 A | 7/2013 |
| KR | 2007-0074748 A | 7/2007 |
| WO | 2011/125105 A1 | 10/2011 |

OTHER PUBLICATIONS

Chinese Office Action dated Feb. 5, 2018 for corresponding Chinese Patent Application No. 2014800490704**.
Korean Office Action dated May 2, 2017 of corresponding Korean Application No. 10-2016-7005607**.
Japanese Office Action dated Aug. 7, 2018 for corresponding Japanese Application No. 2018-095117**.
Japanese Office Action dated Nov. 27, 2018 for corresponding Japanese Application No. 2018-095117**.
Japanese Office Action, Decision to Dismiss the Amendment, dated Mar. 19, 2018 for corresponding Japanese Application No. 2018-095117**.
Japanese Office Action, Decision of Refusal, dated Mar. 19, 2018 for corresponding Japanese Application No. 2018-095117**.
Korean Patent Office Notice of Allowance dated Oct. 29, 2021 for corresponding Korean Application No. 10-2017-7037098.

* cited by examiner

[FIG. 1]
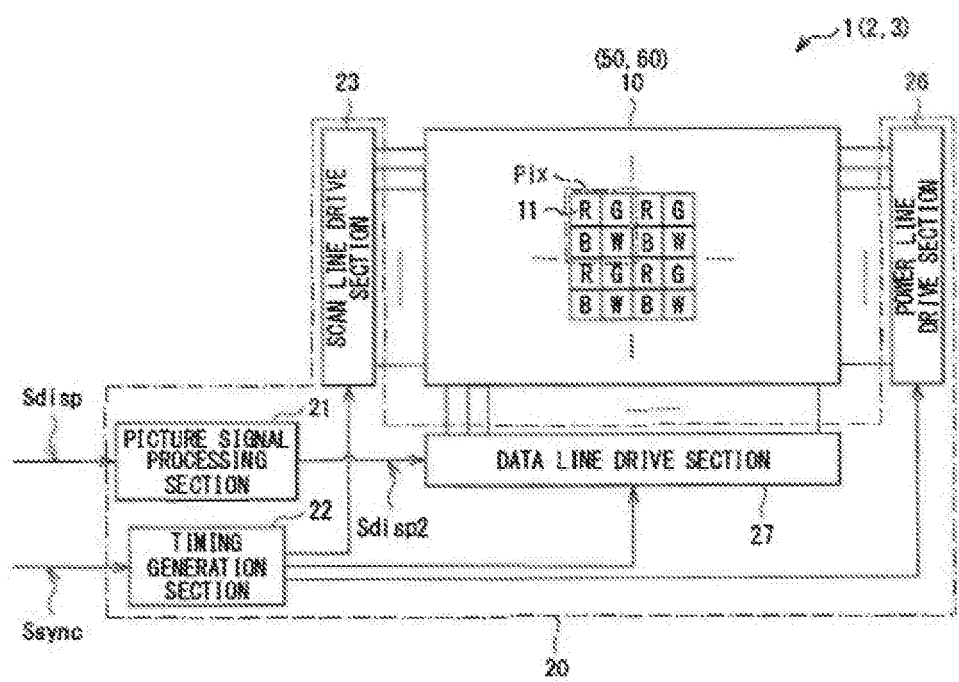

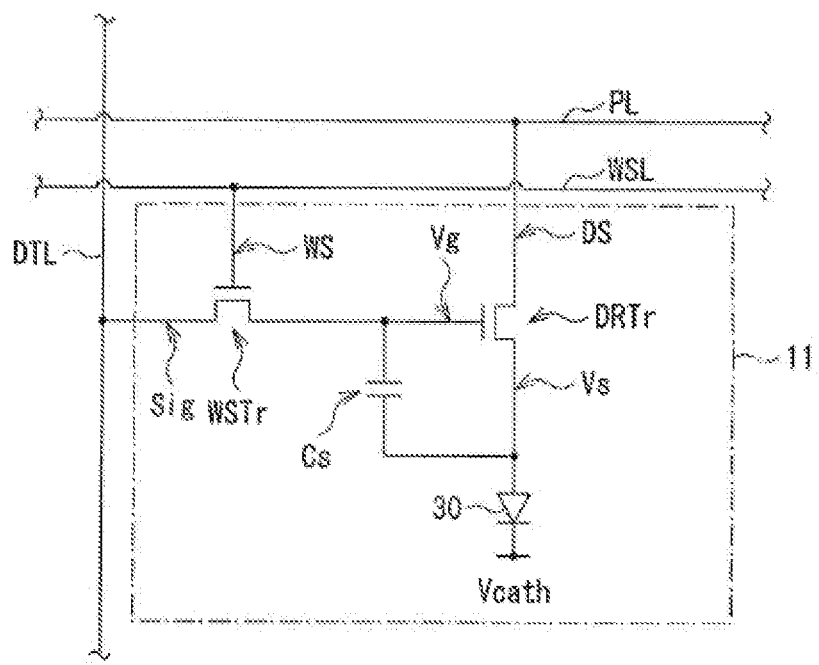
[FIG. 2]

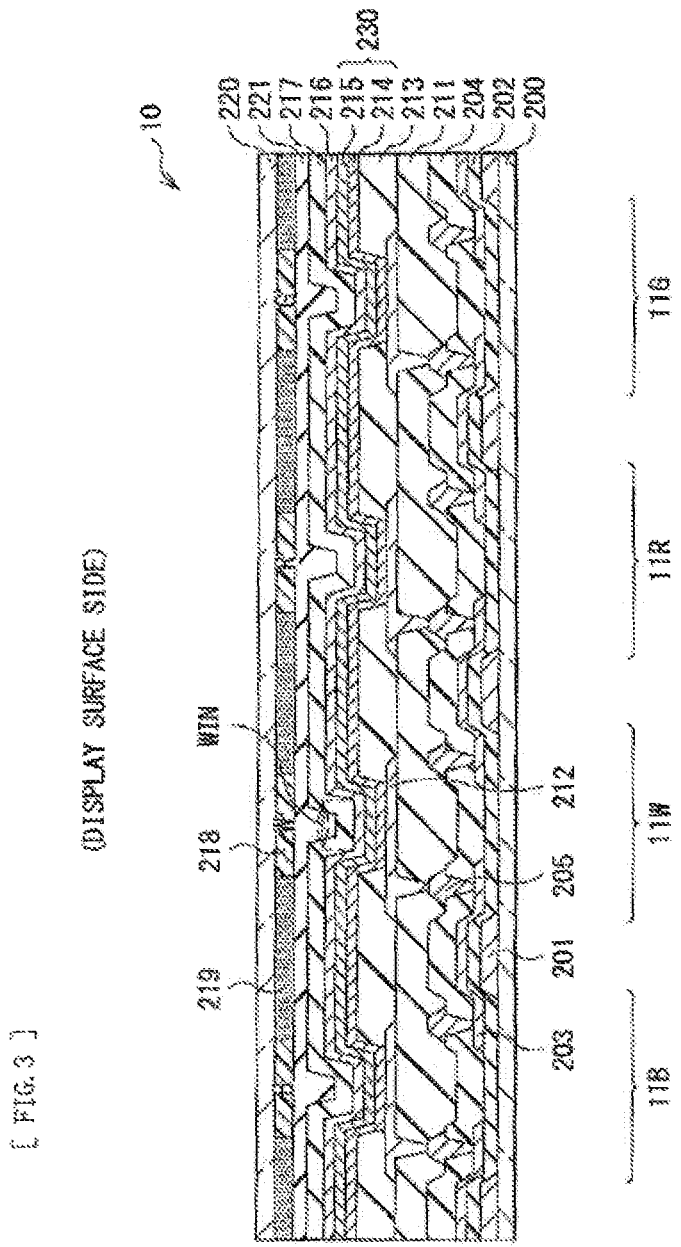
[ FIG. 3 ]

[FIG. 4A]
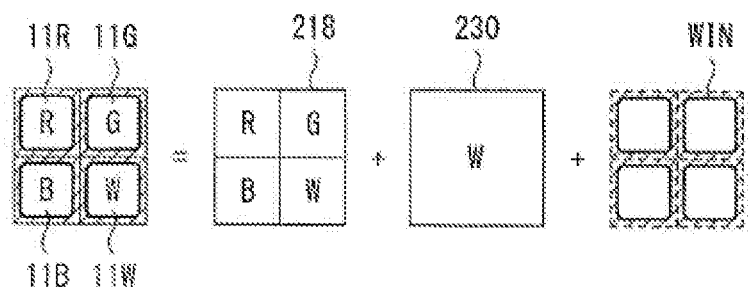
[FIG. 4B]
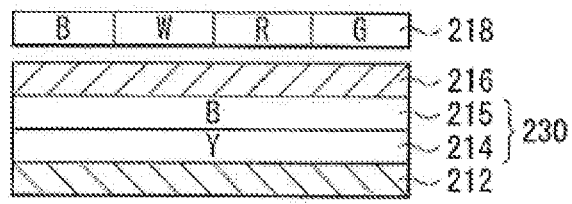
[FIG. 4C]
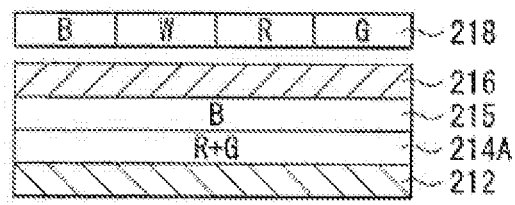

[ FIG. 5 ]
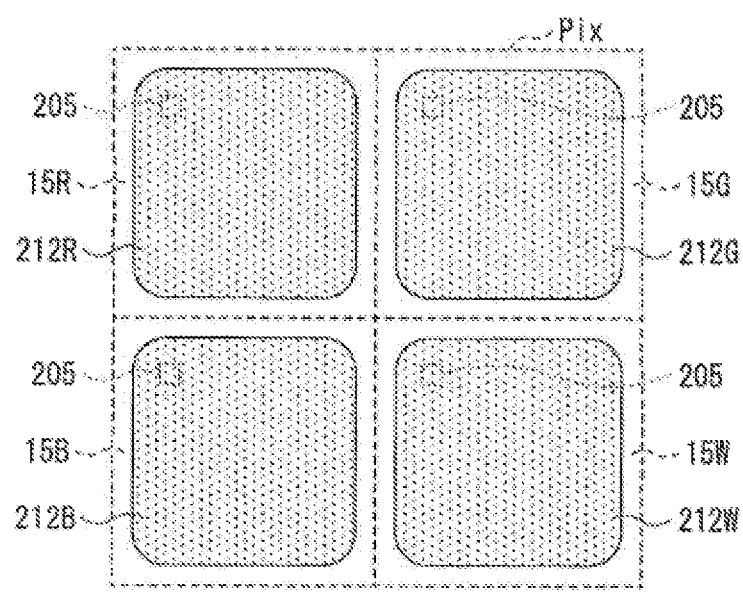
[ FIG. 6 ]
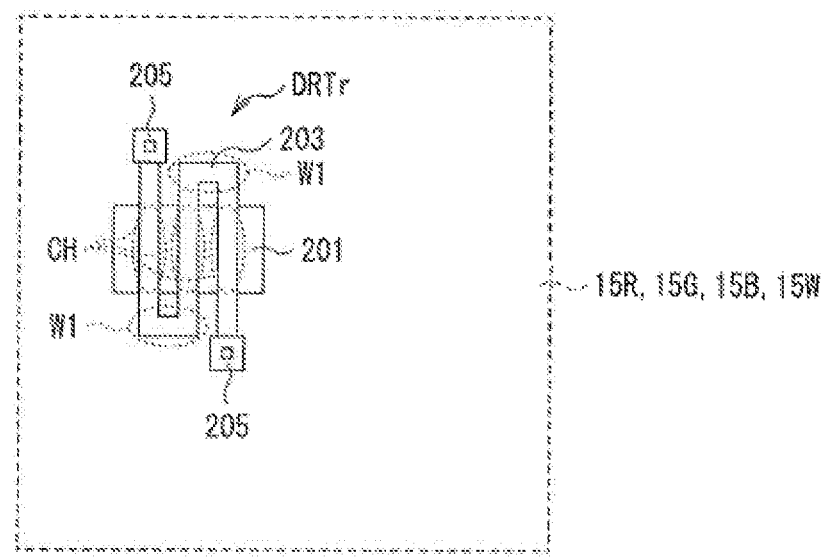

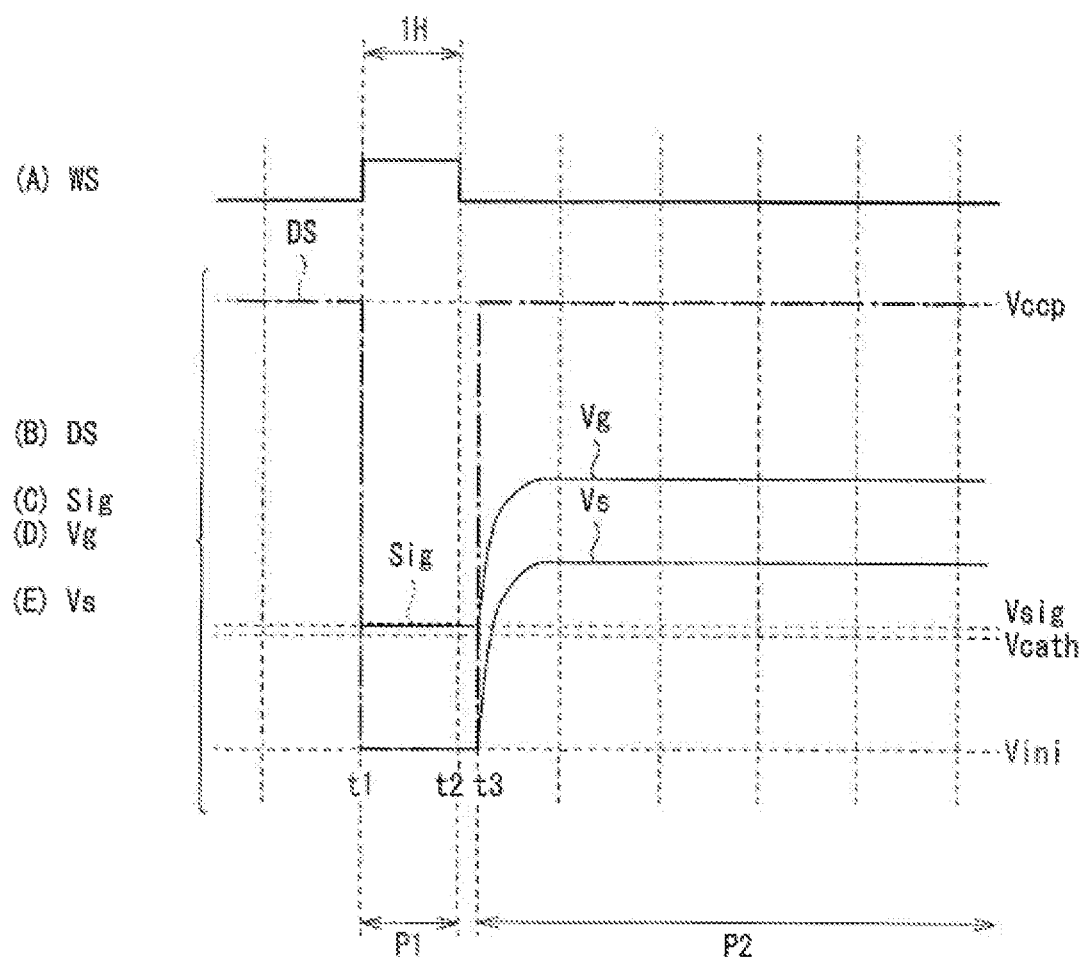

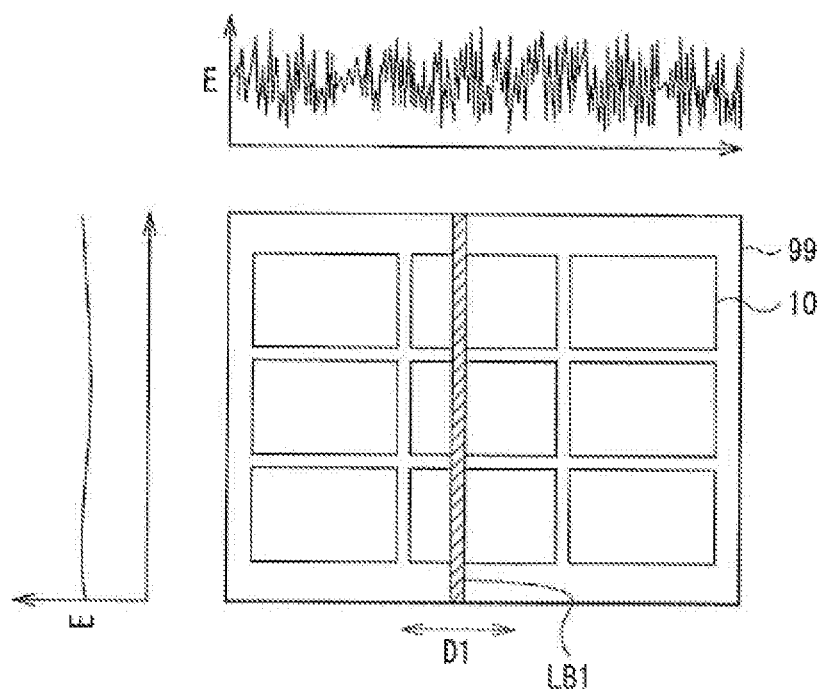
[FIG. 8]

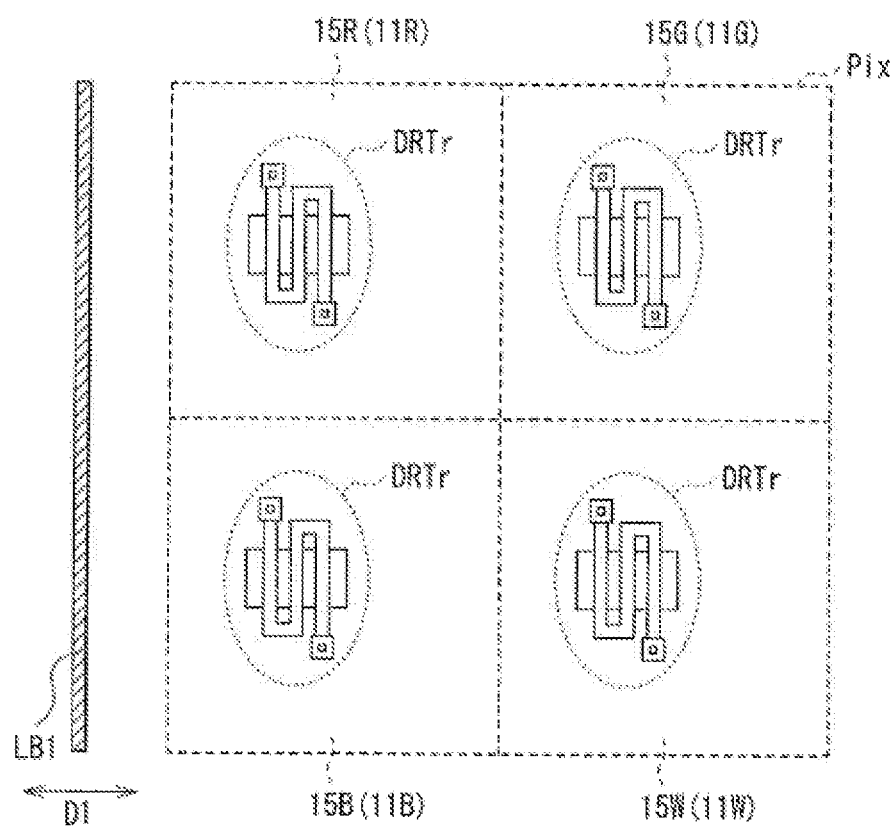
[FIG. 9A]

[FIG. 9B]
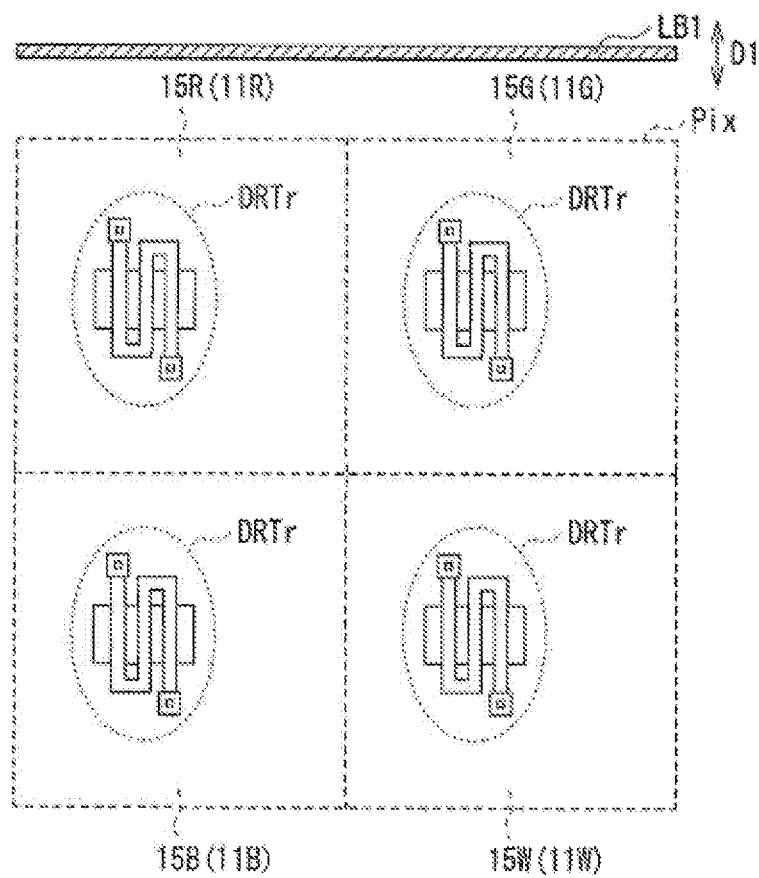

[FIG. 10]
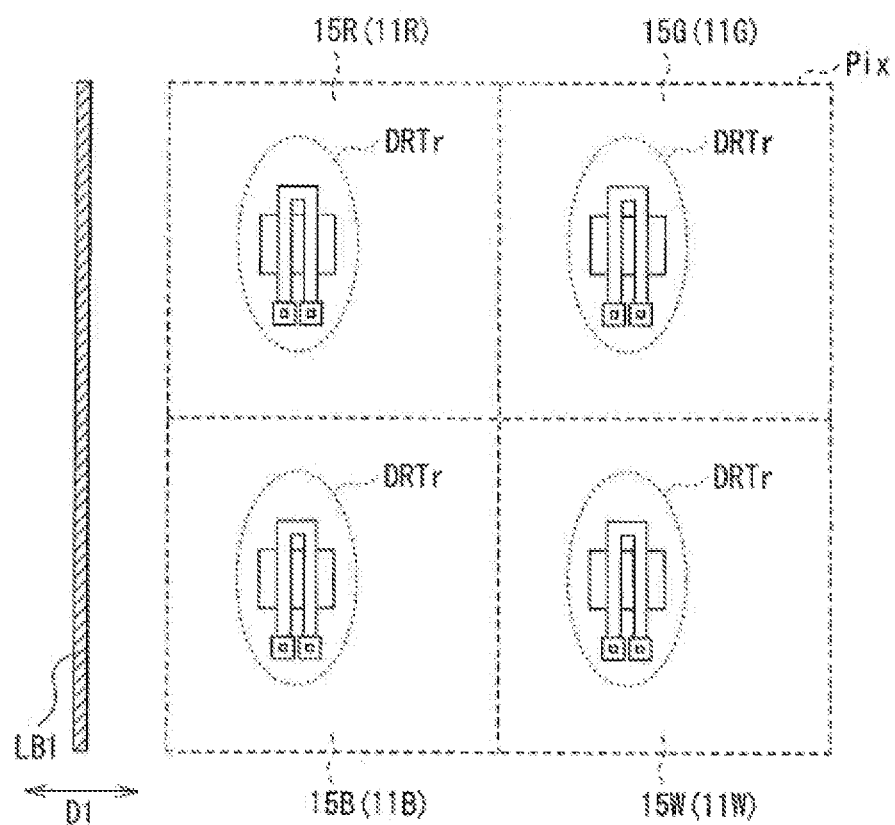

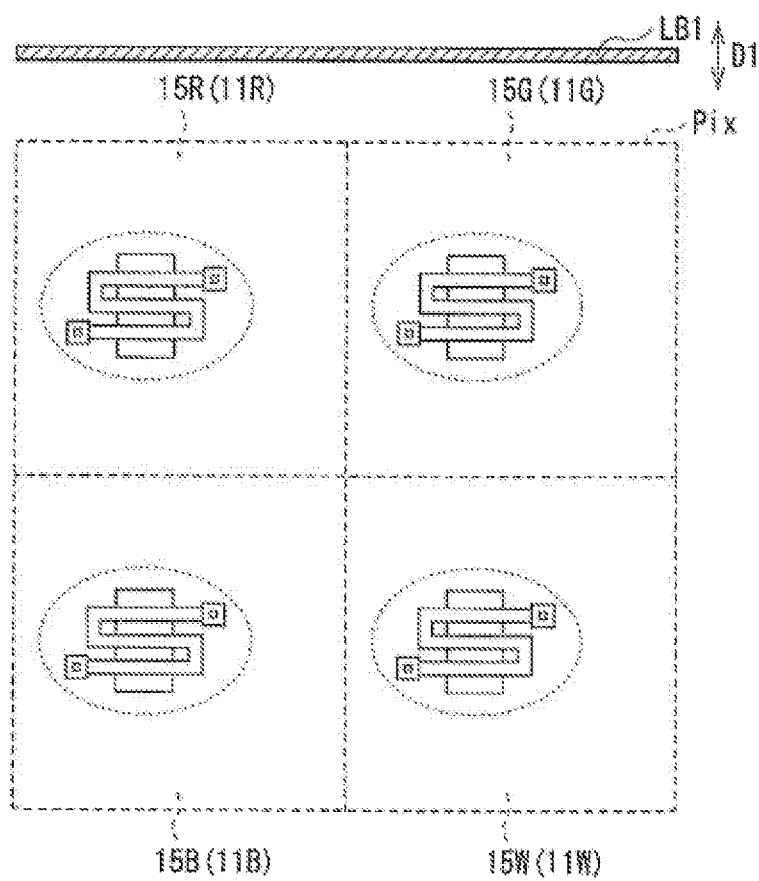
[FIG. 11]

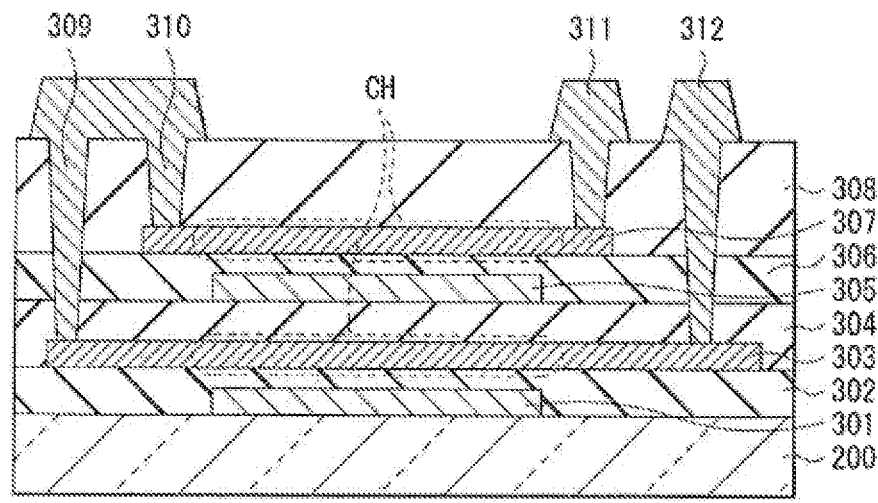
[FIG. 12A]
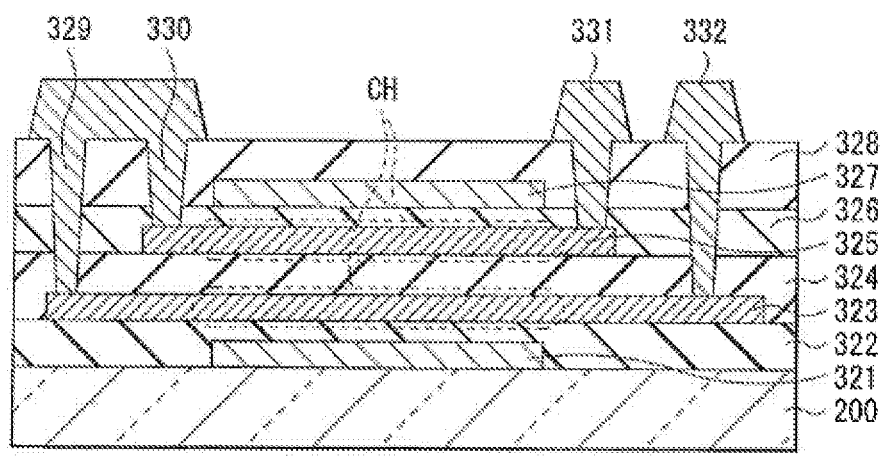
[FIG. 12B]

[ FIG. 12C ]
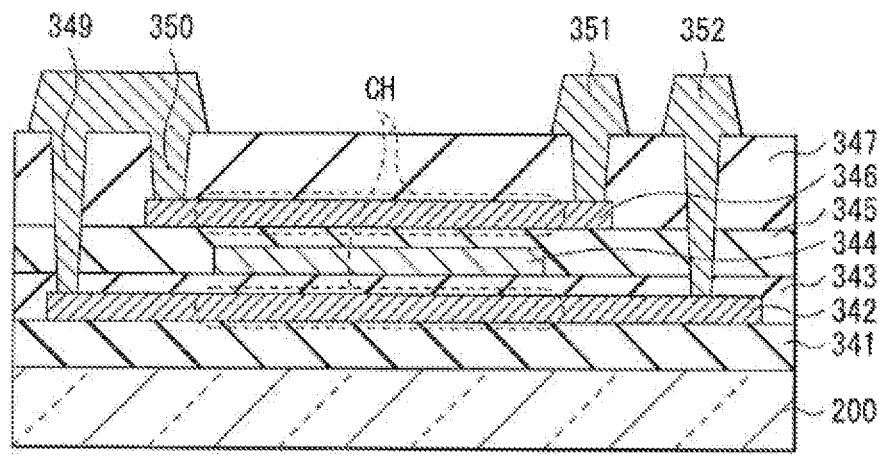
[ FIG. 13 ]
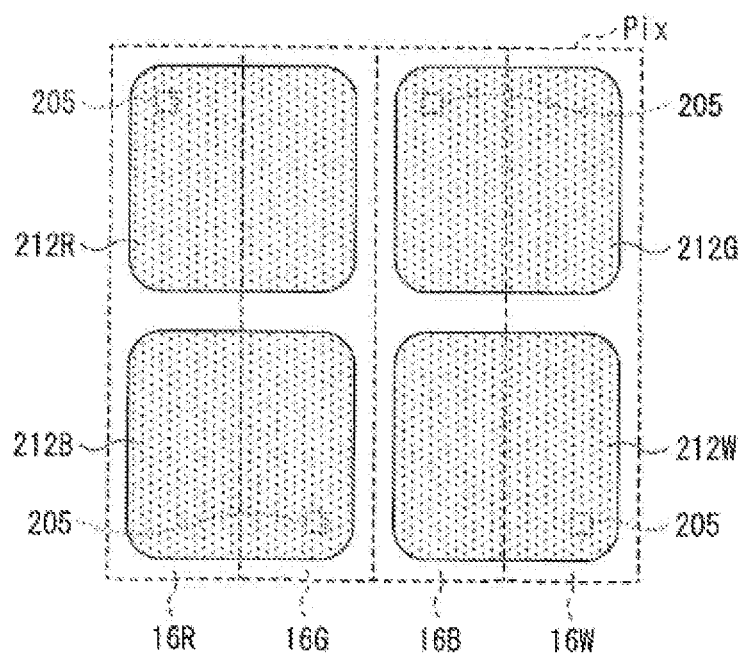

[FIG. 14]
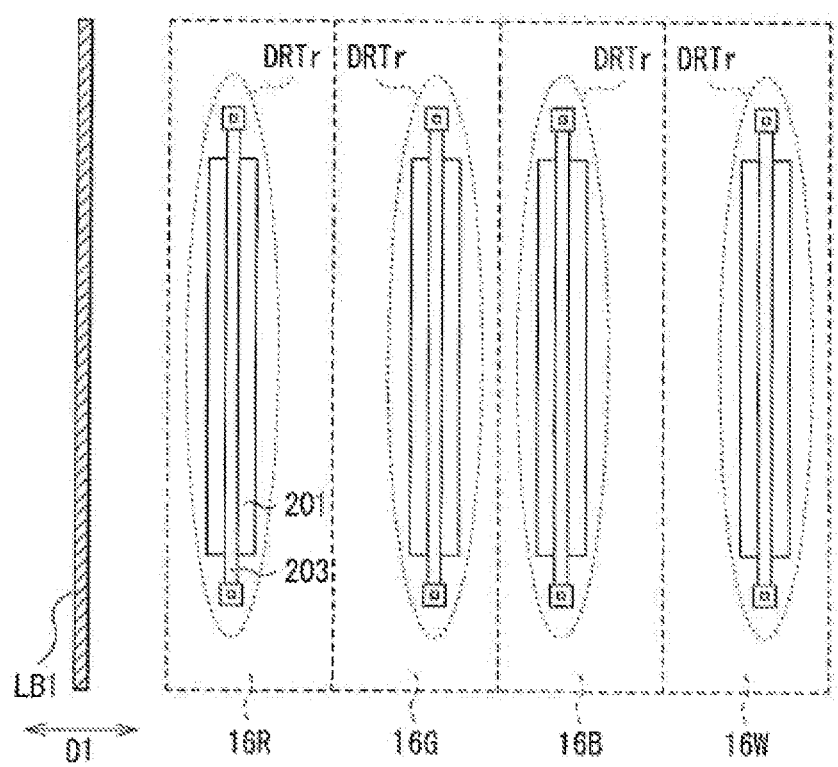

[ FIG. 15 ]
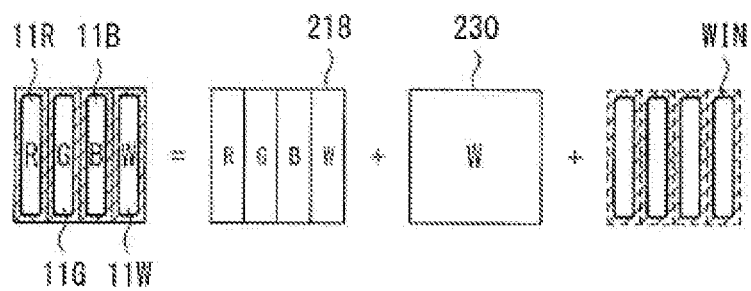
[ FIG. 16A ]
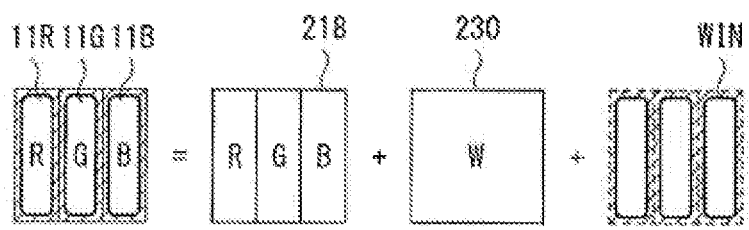
[ FIG. 16B ]
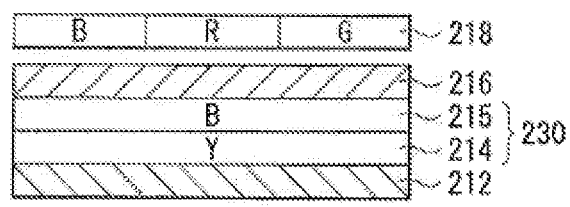

[ FIG. 17A ]
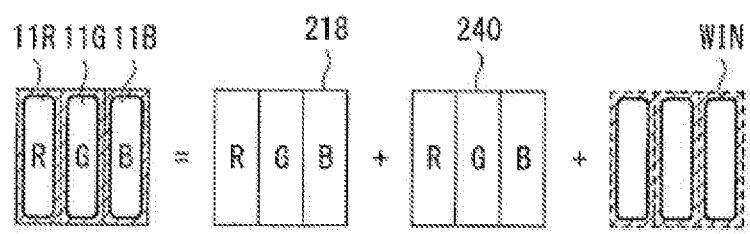
[ FIG. 17B ]
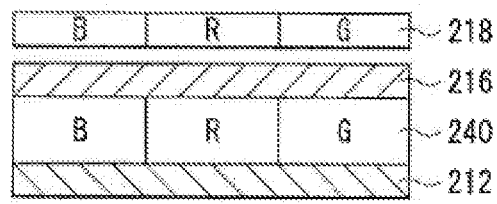

[FIG. 18A]
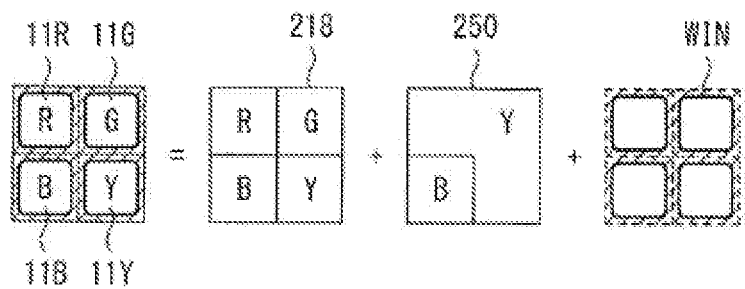
[FIG. 18B]
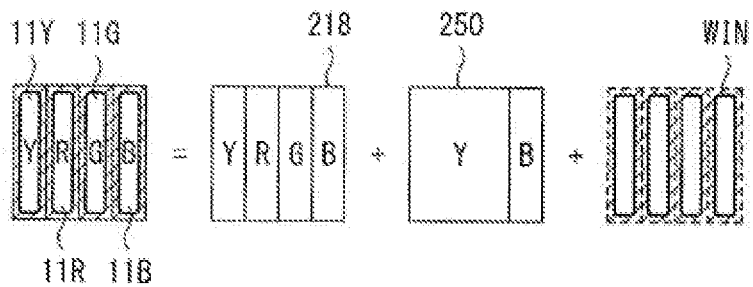
[FIG. 18C]
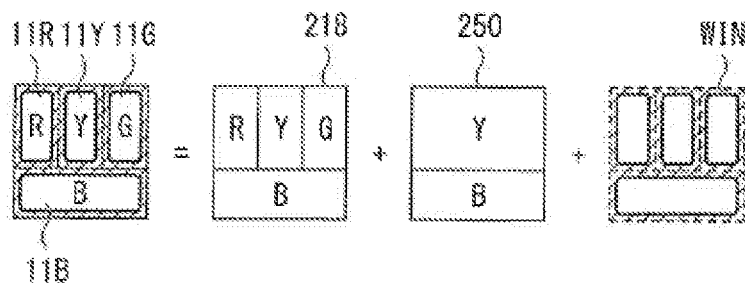
[FIG. 18D]
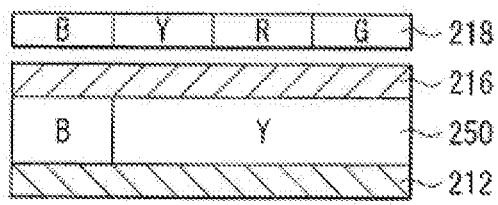

[FIG. 19A]
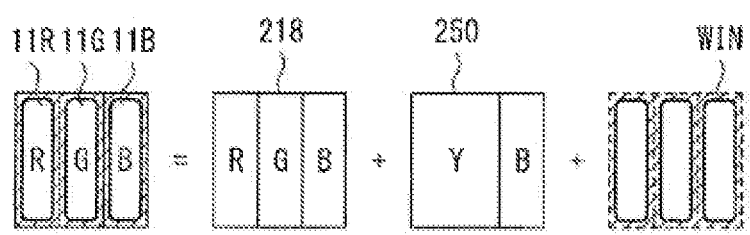
[FIG. 19B]
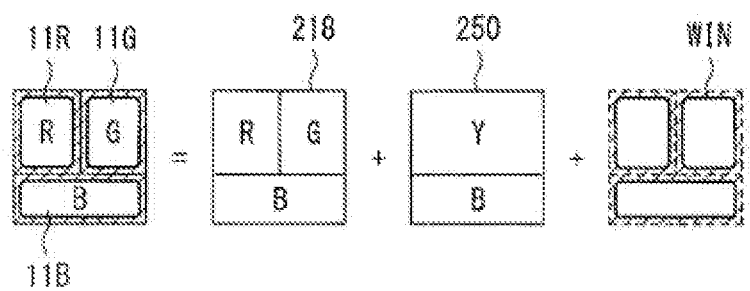
[FIG. 19C]
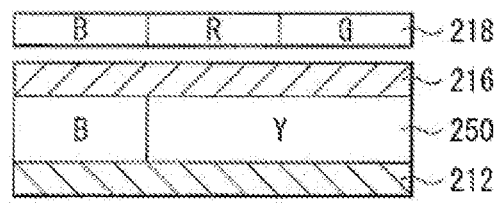

[ FIG. 20A ]
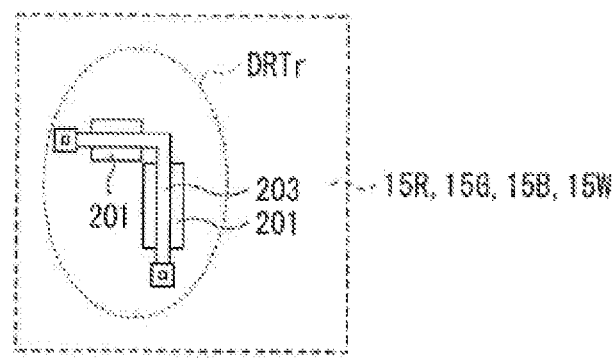
[ FIG. 20B ]
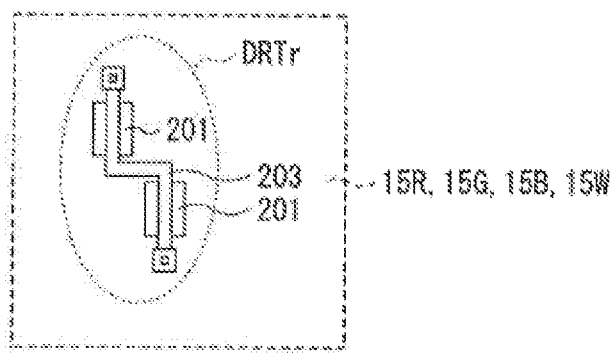

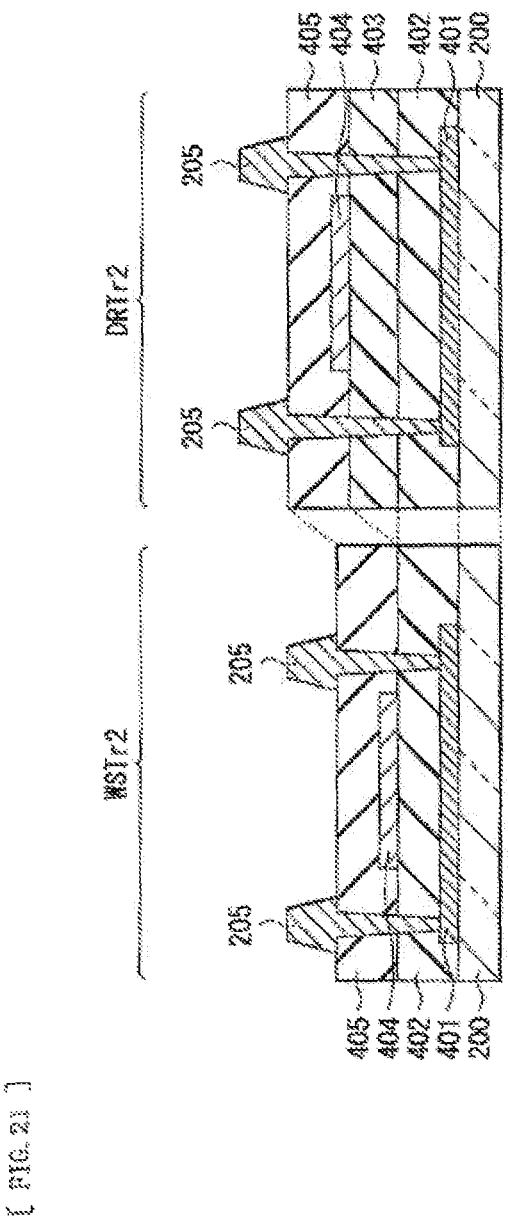
[ FIG. 21 ]

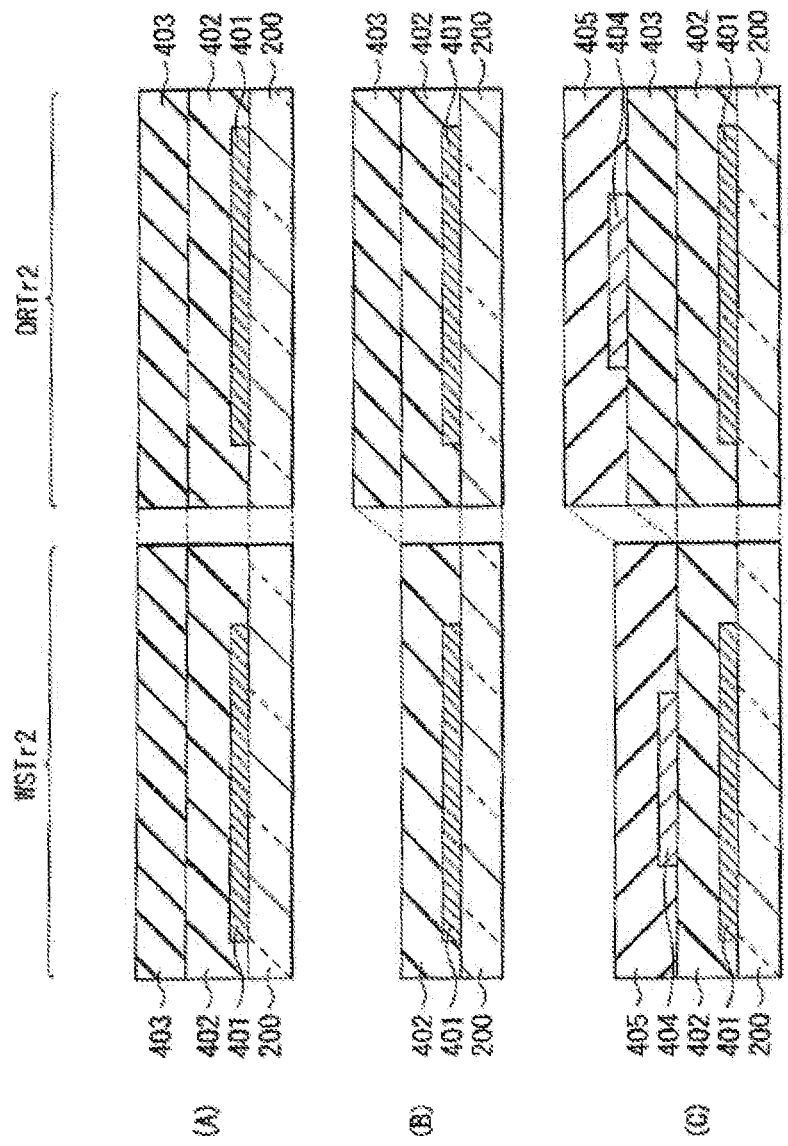
[FIG. 22]

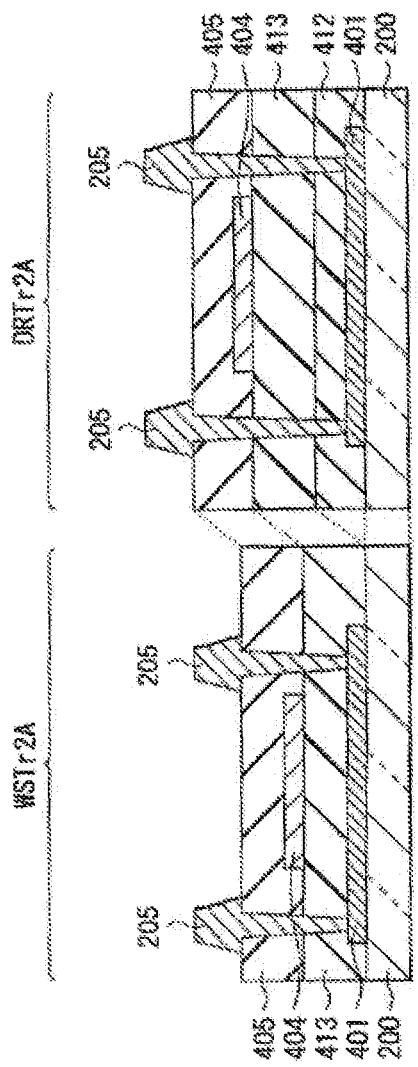
[ FIG. 23 ]

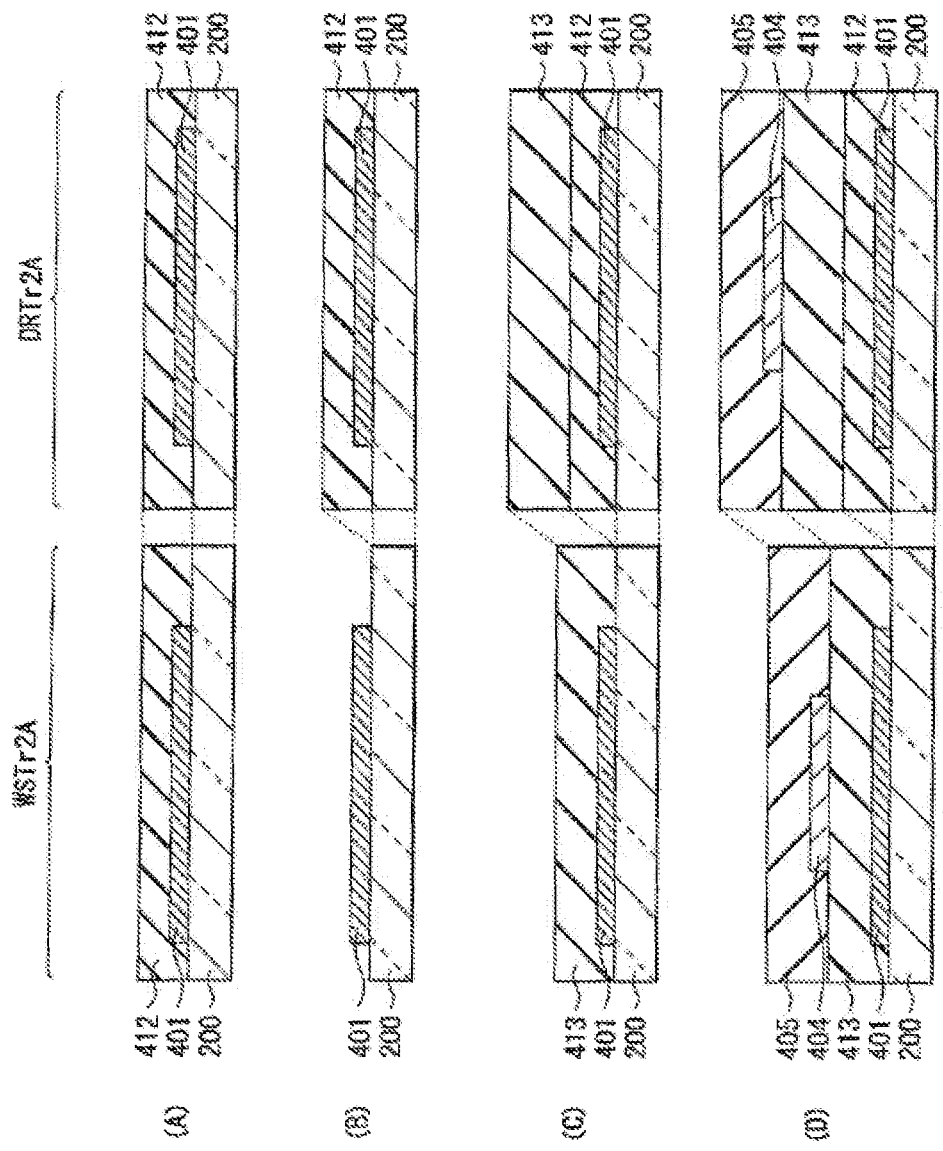

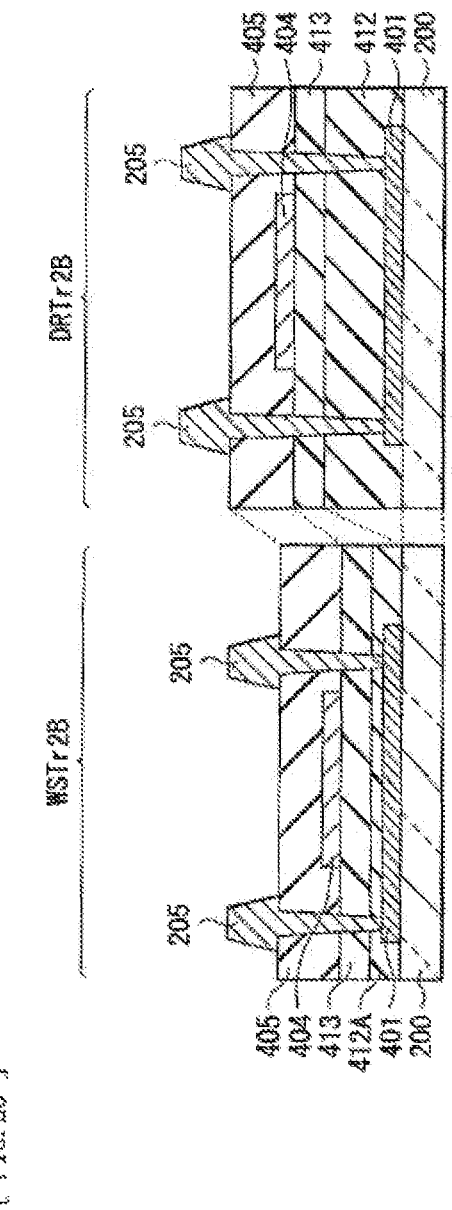
[FIG. 25]

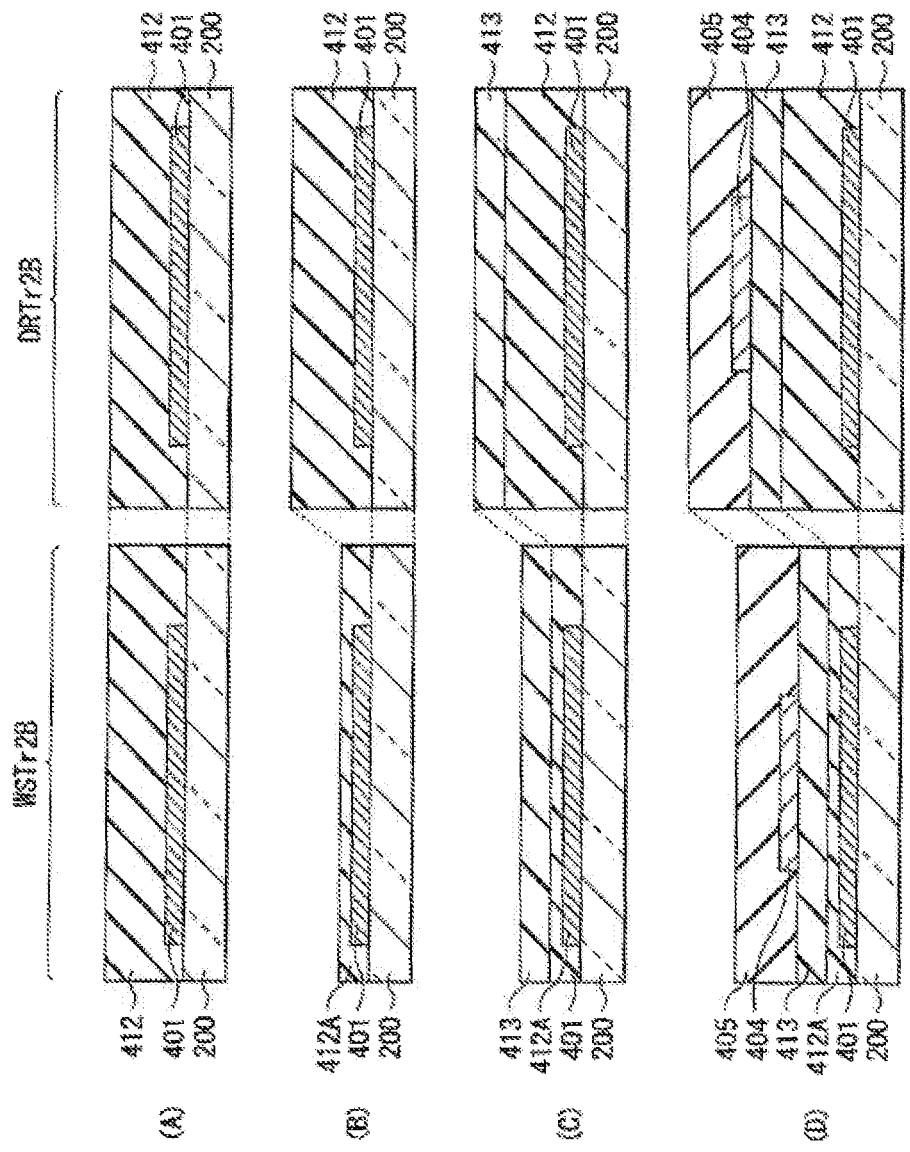
[FIG. 26]

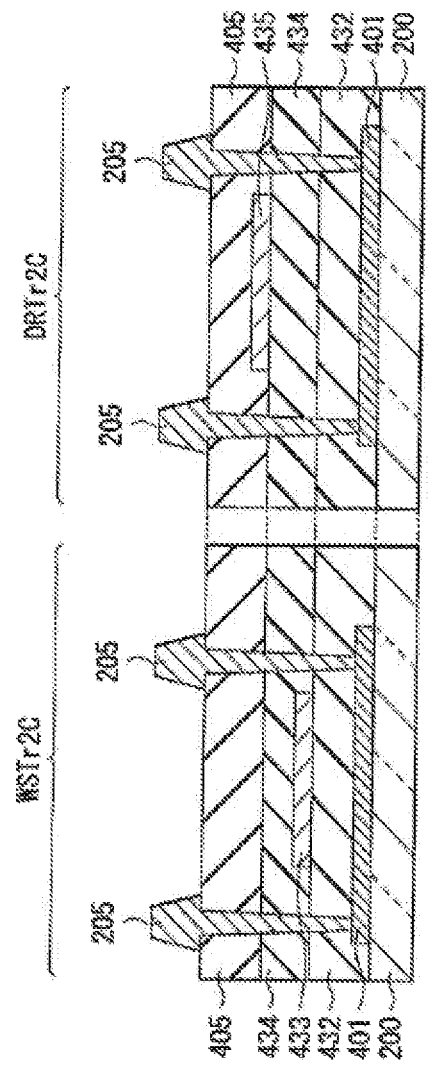

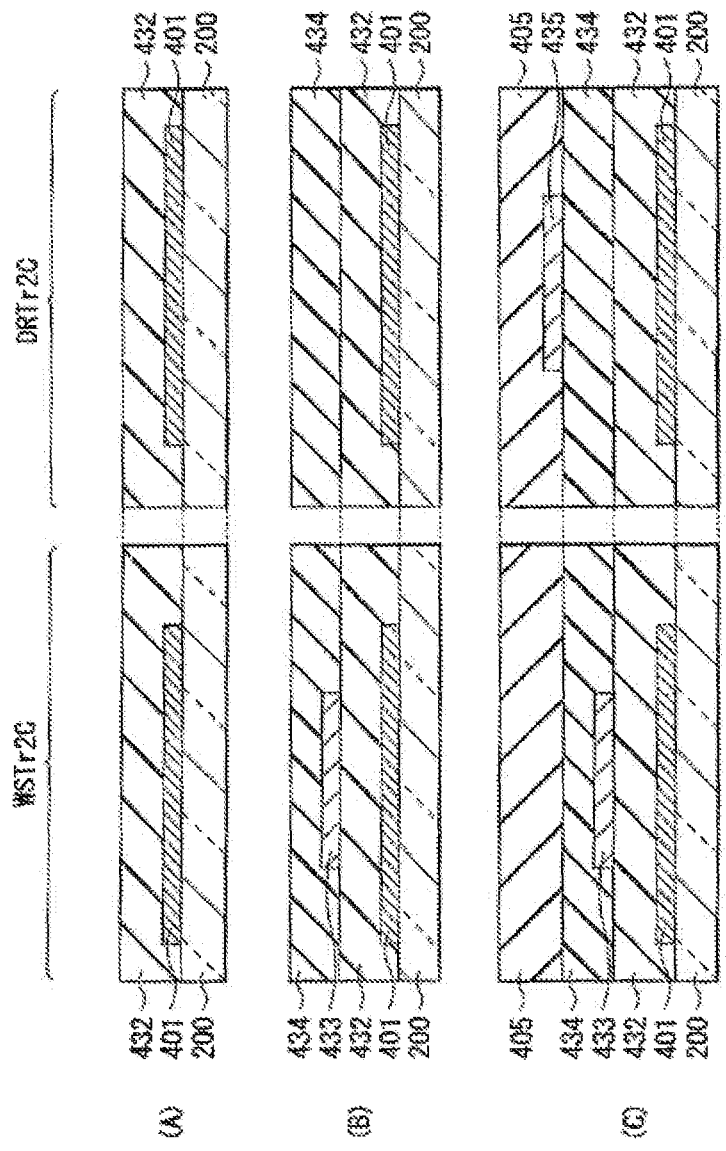
[ FIG. 28 ]

[ FIG. 29 ]
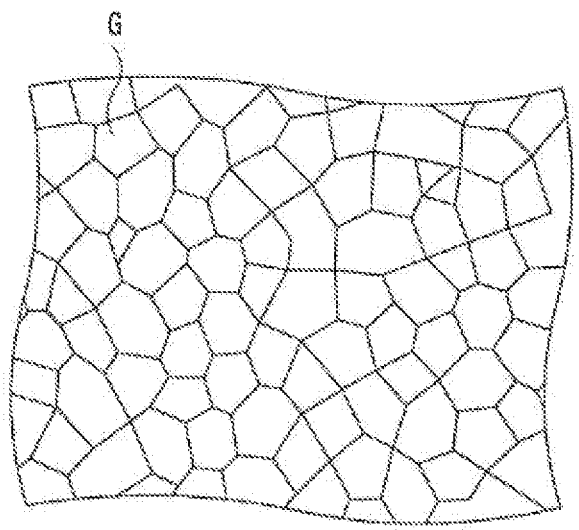
[ FIG. 30 ]
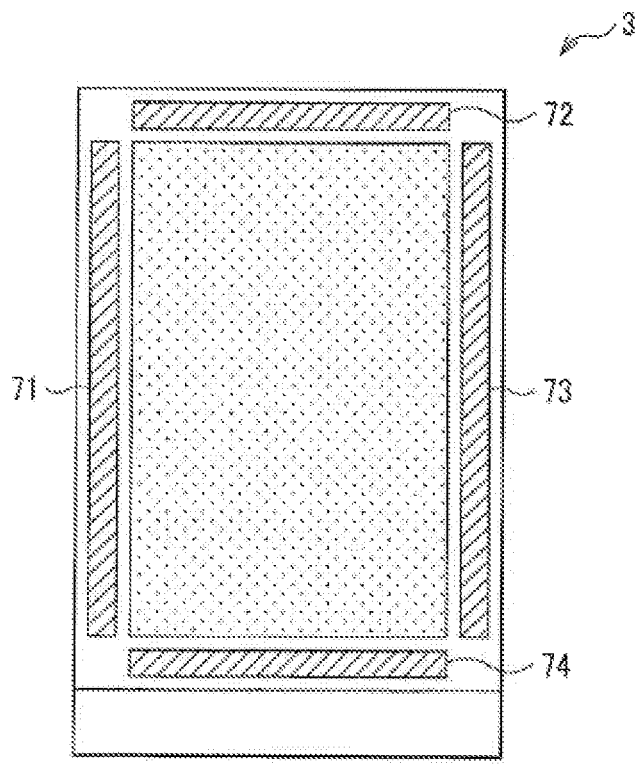

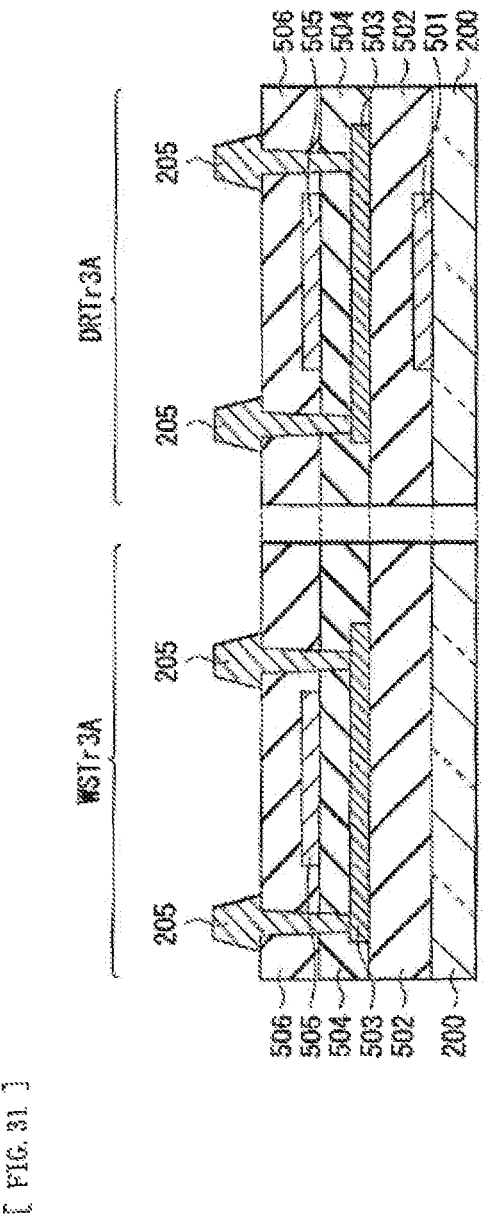

[ FIG. 32 ]
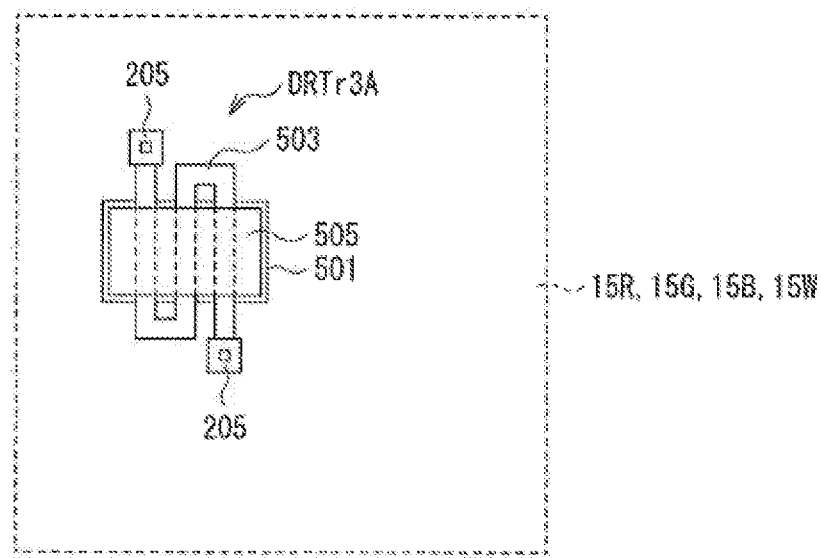
[ FIG. 33 ]
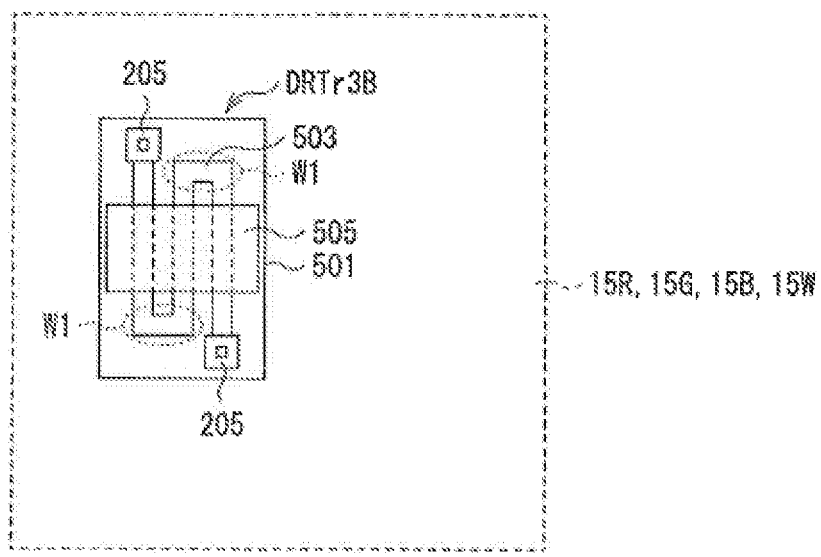

[ FIG. 34 ]
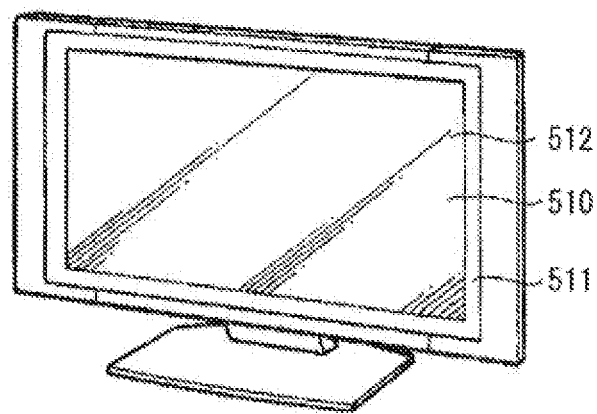
[ FIG. 35 ]
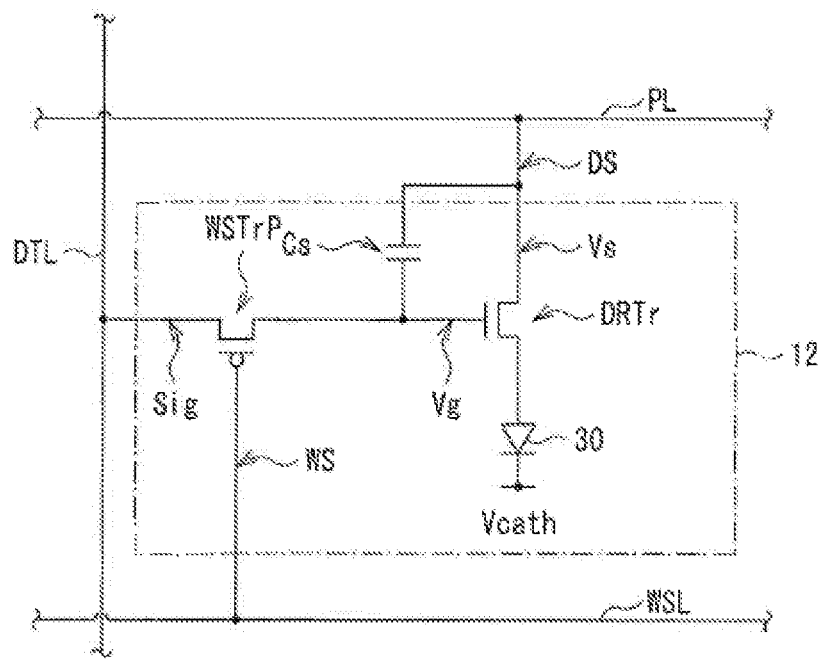

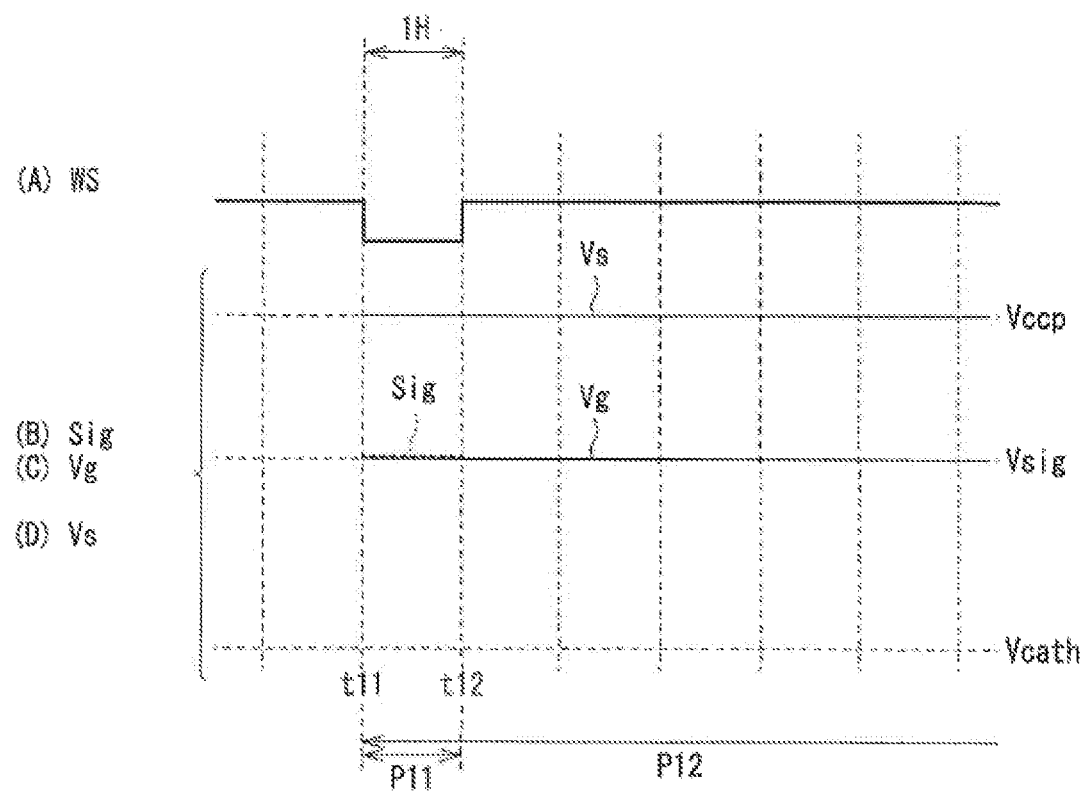
[ FIG. 36 ]

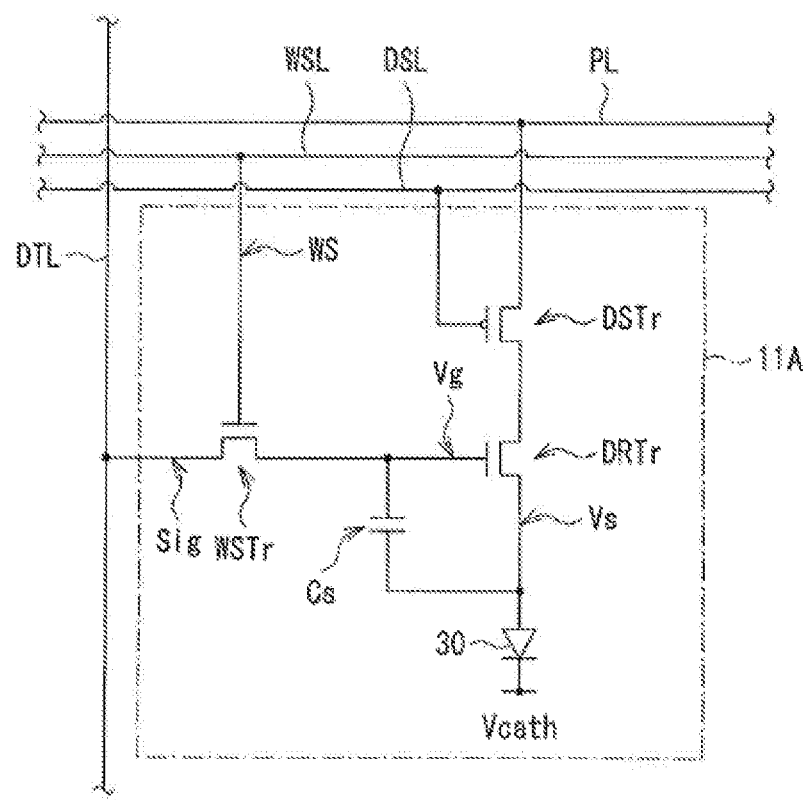
[FIG. 37]

[ FIG. 38A ]
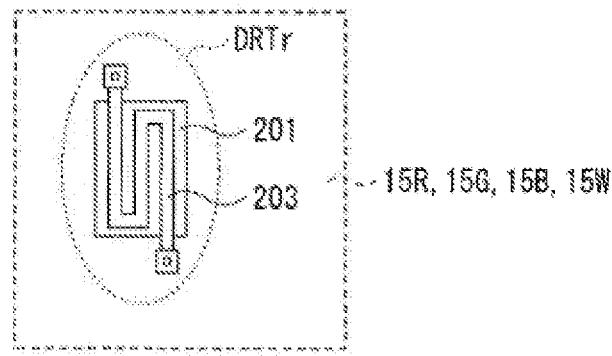
[ FIG. 38B ]
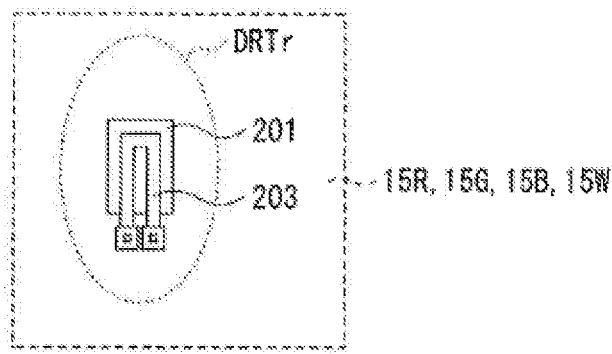
[ FIG. 38C ]
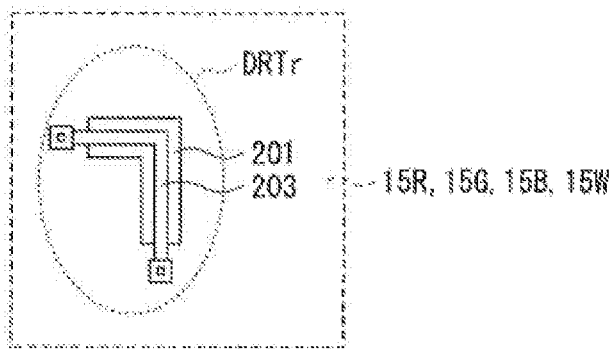
[ FIG. 38D ]
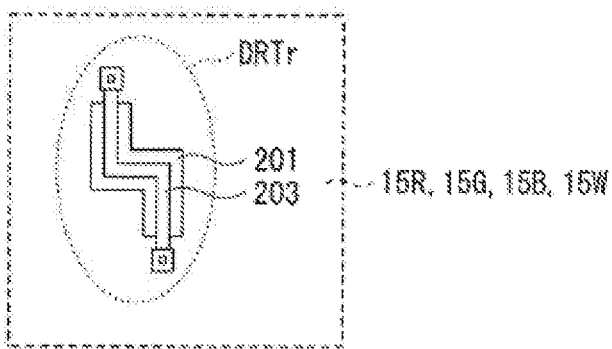

DISPLAY DEVICE, METHOD OF MANUFACTURING THE SAME, AND ELECTRONIC APPARATUS

CROSS REFERENCES TO RELATED APPLICATIONS

The present Application is a Continuation Application of application Ser. No. 16/813,361, filed Mar. 9, 2020, which is a Continuation Application of application Ser. No. 16/369,162, filed Mar. 28, 2019, and issued as U.S. Pat. No. 10,615,238 Apr. 7, 2020, which is a continuation Application of Ser. No. 16/296,612, filed Mar. 8, 2019, and issued as U.S. Pat. No. 10,615,237, Apr. 7, 2020, which is a Continuation Application of application Ser. No. 16/181,838, filed Nov. 6, 2018, and issued as U.S. Pat. No. 10,312,314 Jun. 4, 2019, which is a Continuation Application of application Ser. No. 16/014,753, filed Jun. 21, 2018, and issued as U.S. Pat. No. 10,147,779, Dec. 4, 2018, which is a Continuation Application of U.S. patent application Ser. No. 15/965,153, filed Apr. 27, 2018 and issued as patent Ser. No. 10/121,841 on Nov. 6, 2018, which is a Continuation Application of U.S. patent application Ser. No. 15/813,983, filed Nov. 15, 2017 and issued as patent Ser. No. 10/026,796 on Jul. 17, 2018, which is a Continuation Application of U.S. patent application Ser. No. 14/909,586, filed Feb. 2, 2016 and issued as patent Ser. No. 10/103,212 on Oct. 16, 2018, which is a 371 National Stage Entry of International Application No.: PCT/JP2014/068876, filed on Jul. 16, 2014, which in turn claims the benefit of priority of the Japanese Patent Application No. 2013-189836, filed on Sep. 12, 2013, and the Japanese Patent Application No. 2014-021604, filed on Feb. 6, 2014, both filed with the Japan Patent Office, the entire contents of these applications are incorporated herein by reference.

TECHNICAL FIELD

The present disclosure relates to a display device including a current-driven display element, a method of manufacturing such a display device, and an electronic apparatus provided with such a display device.

BACKGROUND ART

In recent years, in a field of display devices performing image display, a display device (an organic electro luminescence (EL) display device) using a current-driven optical element as a light emitting element, the light emission luminance of which is varied based on a value of a flowing current, such as an organic EL element, has been developed and commercialization thereof is progressing. Unlike a liquid crystal element or other element, the light emitting element is a self light-emitting element, and a separate light source (a backlight) is not required. Therefore, the organic EL display device has characteristics of high visibility of an image, low power consumption, and high response speed of the element, and the like, as compared with a liquid crystal display device which requires a light source.

In such a display device, a unit pixel may include, for example, a write transistor and a drive transistor. The write transistor is adapted to select a unit pixel in which a pixel signal is to be written, and the drive transistor is adapted to supply a current to a light emitting element. For example, in PTL 1, there is disclosed a display device in which a current driving capability of the drive transistor is set lower than a current driving capability of the write transistor. Further, for example, in PTL 2, there is disclosed a display device in which a channel length L of the drive transistor is set larger than a channel length L of the write transistor. Further, for example, in PTL 3, there is disclosed a display device further including an AC transistor, and a ratio (L/W) of a channel length L to a channel width W of the drive transistor is set larger than a ratio (L/W) of a channel length L to a channel width W of the AC transistor.

CITATION LIST

Patent Literature

PTL 1: Japanese Unexamined Patent Application Publication No. 2003-308030
PTL 2: Japanese Unexamined Patent Application Publication No. 2008-46427
PTL 3: Japanese Unexamined Patent Application Publication No. 2005-202371

SUMMARY

Incidentally, in the display device, high image quality is typically desired, and further improvement in image quality is expected.

Therefore, it is desirable to provide a display device, a method of manufacturing the display device, and an electronic apparatus that make it possible to enhance image quality.

An display device according to an embodiment of the disclosure includes a light emitting element and a drive transistor. The drive transistor includes a coupling section and a plurality of channel sections coupled in series through the coupling section. The drive transistor is configured to supply a drive current to the light emitting element.

A method of manufacturing a display device according to an embodiment of the disclosure includes: forming a drive transistor and a write transistor, the drive transistor including a coupling section and a plurality of channel sections coupled in series through the coupling section, and the write transistor configured to transfer a pixel voltage to a gate electrode of the drive transistor; and forming a light emitting element supplied with a current by the drive transistor.

An electronic apparatus according to an embodiment of the disclosure is provided with the foregoing display device, and non-limiting examples of the electronic apparatuses may include a television, a digital camera, a personal computer, a video camera, and a mobile terminal device such as a mobile phone.

In the display device, the method of manufacturing the display device, and the electronic apparatus according to the respective embodiments of the disclosure, the light emitting element is supplied with the drive current from the drive transistor. The drive transistor includes the coupling section and the plurality of channel sections that are coupled in series through the coupling section.

According to the display device, the method of manufacturing the display device, and the electronic apparatus of the respective embodiments of the disclosure, the drive transistor including the coupling section and the plurality of channel sections coupled in series through the coupling section is used, which makes it possible to enhance image quality. Moreover, effects described here are non-limiting. Effects achieved by the technology may be one or more of effects described in the present disclosure.

BRIEF DESCRIPTION OF DRAWINGS

FIG. 1 is a block diagram illustrating a configuration example of a display device according to a first embodiment of the disclosure.

FIG. 2 is a circuit diagram illustrating a configuration example of a sub-pixel illustrated in FIG. 1.

FIG. 3 is a cross-sectional view illustrating a schematic sectional structure of a display section illustrated in FIG. 1.

FIG. 4A is a schematic diagram illustrating a structure example of a pixel illustrated in FIG. 1.

FIG. 4B is another schematic diagram illustrating the structure example of the pixel illustrated in FIG. 1.

FIG. 4C is a schematic diagram illustrating another structure example of the pixel illustrated in FIG. 1.

FIG. 5 is an explanatory diagram illustrating a configuration example of a circuit region.

FIG. 6 is a plan view illustrating a configuration example of a drive transistor illustrated in FIG. 2.

FIG. 7 is a timing waveform chart illustrating an operation example of the display device illustrated in FIG. 1.

FIG. 8 is an explanatory diagram for explaining scanning by an ELA apparatus.

FIG. 9A is an explanatory diagram illustrating an example of a direction of the drive transistor illustrated in FIG. 2.

FIG. 9B is an explanatory diagram illustrating another example of the direction of the drive transistor illustrated in FIG. 2.

FIG. 10 is a plan view illustrating a configuration example of a drive transistor according to a modification of the first embodiment.

FIG. 11 is a plan view illustrating a configuration example of a drive transistor according to another modification of the first embodiment.

FIG. 12A is a schematic cross-sectional view illustrating a structure example of a drive transistor according to another modification of the first embodiment.

FIG. 12B is a schematic cross-sectional view illustrating a structure example of a drive transistor according to still another modification of the first embodiment.

FIG. 12C is a schematic cross-sectional view illustrating a structure example of a drive transistor according to still another modification of the first embodiment.

FIG. 13 is an explanatory diagram illustrating a structure example of a circuit region according to another modification of the first embodiment.

FIG. 14 is a plan view illustrating a configuration example of a drive transistor in the circuit region illustrated in FIG. 13.

FIG. 15 is a schematic diagram illustrating a structure example of a pixel according to still another modification of the first embodiment.

FIG. 16A is a schematic diagram illustrating a structure example of a pixel according to still another modification of the first embodiment.

FIG. 16B is another schematic diagram illustrating the structure example of the pixel illustrated in FIG. 16A.

FIG. 17A is a schematic diagram illustrating a structure example of a pixel according to still another modification of the first embodiment.

FIG. 17B is another schematic diagram illustrating the structure example of the pixel illustrated in FIG. 17A.

FIG. 18A is a schematic diagram illustrating a structure example of a pixel according to still another modification of the first embodiment.

FIG. 18B is a schematic diagram illustrating a structure example of a pixel according to still another modification of the first embodiment.

FIG. 18C is a schematic diagram illustrating a structure example of a pixel according to still another modification of the first embodiment.

FIG. 18D is another schematic diagram illustrating the structure example of the pixel illustrated in any of FIGS. 18A to 18C.

FIG. 19A is a schematic diagram illustrating a structure example of a pixel according to still another modification of the first embodiment.

FIG. 19B is a schematic diagram illustrating a structure example of a pixel according to still another modification of the first embodiment.

FIG. 19C is a schematic diagram illustrating a structure example of the pixel illustrated in any of FIGS. 19A and 19B.

FIG. 20A is a plan view illustrating a configuration example of a drive transistor according to another modification of the first embodiment.

FIG. 20B is a plan view illustrating a configuration example of a drive transistor according to still another modification of the first embodiment.

FIG. 21 is a sectional diagram illustrating schematic sectional structures of respective transistors according to a second embodiment.

FIG. 22 is an explanatory diagram illustrating a process of manufacturing the transistors illustrated in FIG. 21.

FIG. 23 is a sectional diagram illustrating schematic sectional structures of respective transistors according to a modification of the second embodiment.

FIG. 24 is an explanatory diagram illustrating a process of manufacturing the transistors illustrated in FIG. 23.

FIG. 25 is a sectional diagram illustrating schematic sectional structures of transistors according to a modification of the second embodiment.

FIG. 26 is an explanatory diagram illustrating a process of manufacturing the transistors illustrated in FIG. 25.

FIG. 27 is a sectional diagram illustrating schematic sectional structures of respective transistors according to a modification of the second embodiment.

FIG. 28 is an explanatory diagram illustrating a process of manufacturing the transistors illustrated in FIG. 27.

FIG. 29 is an explanatory diagram illustrating grains of a transistor according to a third embodiment.

FIG. 30 is a schematic diagram illustrating an implementation example of a display device according to the third embodiment.

FIG. 31 is a sectional diagram illustrating schematic sectional structures of respective transistors according to a modification of the third embodiment.

FIG. 32 is a plan view illustrating a configuration example of the drive transistor illustrated in FIG. 31.

FIG. 33 is a plan view illustrating a configuration example of a drive transistor according to another modification of the third embodiment.

FIG. 34 is a perspective view illustrating an appearance configuration of a television to which the display device according to any of the embodiments is applied.

FIG. 35 is a circuit diagram illustrating a configuration example of a sub-pixel according to a modification.

FIG. 36 is a timing waveform chart illustrating an operation example of a display device including the sub-pixel illustrated in FIG. 35.

FIG. 37 is a circuit diagram illustrating a configuration example of a sub-pixel according to another modification.

FIG. 38A is a plan view illustrating a configuration example of a drive transistor according to a reference example.

FIG. 38B is a plan view illustrating a configuration example of a drive transistor according to another reference example.

FIG. 38C is a plan view illustrating a configuration example of a drive transistor according to still another reference example.

FIG. 38D is a plan view illustrating a configuration example of a drive transistor according to still another reference example.

MODE FOR CARRYING OUT THE INVENTION

Some embodiments of the disclosure are described in detail below with reference to drawings. Moreover, description thereof is given in the following order.
1. First Embodiment
2. Second Embodiment
3. Third Embodiment
4. Application examples 1. First Embodiment Configuration Example FIG. 1 illustrates a configuration example of a display device according to first embodiment. A display device 1 may be an active matrix display device using an organic EL element. Moreover, a display driving method and a method of manufacturing the display device according to respective embodiments of the disclosure are implemented by the present embodiment, and the description thereof is therefore given together.

The display device 1 may include a display section 10 and a drive section 20. The drive section 20 may include a picture signal processing section 21, a timing generation section 22, a scan line drive section 23, a power line drive section 26, and a data line drive section 27.

The display section 10 may be configured of a plurality of pixels Pix that are arranged in a matrix. Each of the pixels Pix may include four sub-pixels 11 (11R, 11G, 11B, and 11W) of red (R), green (G), blue (B), and white (W). In this example, the four sub-pixels 11R, 11G, 11B, and 11W may be arranged in two rows and two columns in each of the pixels Pix. More specifically, in each of the pixels Pix, the red (R) sub-pixel 11R may be disposed on upper left, the green (G) sub-pixel 11G may be disposed on upper right, the blue (B) sub-pixel 11B may be disposed on lower left, and the white (W) sub-pixel 11W may be disposed on lower right.

FIG. 2 illustrates an example of a circuit configuration of the sub-pixel 11. The display section 10 may include a plurality of scan lines WSL and a plurality of power lines PL that extend in the row direction, and a plurality of data lines DTL extending in a column direction. Although not illustrated, one end of each of the data lines DTL may be coupled to the data line drive section 27, one end of each of the scan lines WSL may be coupled to the scan line drive section 23, and one end of each of the power lines PL may be coupled to the power line drive section 26. Each of the sub-pixels 11 may be disposed at an intersection between each of the scan lines WSL and each of the power lines DTL.

The sub-pixel 11 may include a write transistor WSTr, a drive transistor DRTr, a light emitting element 30, and a capacitor Cs. In other words, in this example, the sub-pixel 11 may have a so-called "2Tr1C" configuration that is configured of two transistors (the write transistor WSTr and the drive transistor DRTr) and one capacitor Cs.

The write transistor WSTr and the drive transistor DRTr may be each configured of, for example, an N-channel metal oxide semiconductor (MOS) thin film transistor (TFT). A gate of the write transistor WSTr may be coupled to the scan line WSL, a source thereof may be coupled to the data line DTL, and a drain thereof may be coupled to a gate of the drive transistor DRTr and one end of the capacitor Cs. The gate of the drive transistor DRTr may be coupled to the drain of the write transistor WSTr and the one end of the capacitor Cs, a drain thereof may be coupled to the power line PL, and a source thereof may be coupled to the other end of the capacitor Cs and an anode of the light emitting element 30.

The one end of the capacitor Cs may be coupled to, for example, the gate of the drive transistor DRTr, and the other end thereof may be coupled to, for example, the source of the drive transistor DRTr. The light emitting element 30 may be a light emitting element configured of an organic EL element, and the anode thereof may be coupled to the source of the drive transistor DRTr and the other end of the capacitor Cs, and a cathode thereof may be supplied with a voltage Vcath that is a direct-current voltage by the drive section 20. The light emitting element 30 may emit white light. More specifically, in this example, as will be described later, the sub-pixels 11R, 11G, 11B, and 11W may generate light of red (R), green (G), blue (B), and white (W), respectively, with use of the light emitting element 30 emitting white light and a color filter 218 (described later).

FIG. 3 is a sectional diagram of the display section 10. The display section 10 may include a transparent substrate 200, a gate 201, a polysilicon 203, an anode 212, a light emitting layer 230, a cathode 216, and the color filter 218.

The transparent substrate 200 may be a support substrate of the display section 10, which may be formed of, for example, glass or plastic. Further, although the transparent substrate 200 is used in this example; alternatively, a non-transparent substrate such as a metal plate may be used. The gate 201 may be selectively formed on the transparent substrate 200. The gate 201 may be formed of, for example, molybdenum (Mo). An insulating layer 202 may be provided on the transparent substrate 200 and the gate 201. The insulating layer 202 may be formed of, for example, silicon oxide (SiO2) or silicon nitride (SiNx). The polysilicon 203 may be so provided on the insulating layer 202 as to cover a region corresponding to the gate 201. The gate 201 and the polysilicon 203 may configure a drive transistor DRTr and any other devices. Moreover, in this example, the transistor has a so-called bottom gate structure in which the gate 201 is formed below the polysilicon 203; however, the structure of the transistor is not limited thereto. The transistor may have a so-called top-gate structure in which a gate is formed above a polysilicon. An insulating layer 204 may be provided on the polysilicon 203 and the insulating layer 202. The insulating layer 204 may be formed of a material similar to that of the insulating layer 202, for example. Further, a contact/wiring 205 may be so provided in a portion of the region where the polysilicon 203 is provided as to penetrate the insulating layer 204. The wiring 205 may be configured of three layers of, for example, titanium (Ti)/aluminum (Al)/titanium (Ti).

An insulating layer 211 may be provided on the insulating layer 204. The insulating layer 211 may be formed of, for example, polyimide or acrylic resin. An anode 212 may be selectively formed on the insulating layer 211. The anode 212 may penetrate the insulating layer 211 to be coupled to the contact/wiring 205 relating to the source of the drive transistor DRTr. The anode 212 may be formed of, for example, ITO/Al alloy, Al alloy, ITO/Ag alloy, or ITO/Ag alloy. In other words, the anode 212 may desirably have property to reflect light. An insulating layer 213 may be provided on the anode 212 and the insulating layer 211. The insulating layer 213 may be formed of a material similar to that of the insulating layer 211, for example. An opening WIN may be provided at a portion of the region where the anode 212 is formed in the insulating layer 213. The light emitting layer 230 configured of a yellow light emitting layer 214 and a blue light emitting layer 215 may be uniformly provided above the anode 212 and the insulating layer 213. The yellow light emitting layer 214 may be an organic EL layer emitting yellow (Y) light, and may be formed of a material emitting yellow light. The blue light emitting layer 215 may be an organic EL layer emitting blue (B) light, and may be formed of a material emitting blue light. Moreover, in this example, the blue light emitting layer 215 is laminated on the yellow light emitting layer 214; however, the structure is not limited thereto. Alternatively, for example, the yellow light emitting layer 214 may be laminated on the blue light emitting layer 215. The cathode 216 may be uniformly provided on the blue light emitting layer 215. The cathode 216 may be a transparent or semi-transparent electrode, and may be formed of, for example, magnesium silver (MgAg) or IZO (registered trademark). In the case where the cathode 216 is formed of magnesium silver, the cathode 216 with the thickness of about several nm may be made semi-transparent. In the case where the cathode 216 is formed of IZO, it is desirable to form the cathode 216 to have a film thickness in a range from several tens nm to several thousand nm, for example. In other words, IZO is a transparent material, this allows for formation of the cathode 216 with a slightly large thickness to achieve a desired low sheet resistance value. An insulating layer 217 may be provided on the cathode 216. The insulating layer 217 may be formed of, for example, silicon nitride (SiNx). The insulating layer 217 may be provided to prevent change of characteristics such as light emission efficiency that is caused by moisture entering the light emitting layer 230. Moreover, when issues caused by entering of moisture are resolved by any other technology, the insulating layer 217 may be omitted. A transparent substrate 220 may be bonded to the insulating layer 217 with the insulating layer 221 that is a sealing resin in between. The transparent substrate 220 may have the color filter 218 and a black matrix 219 formed on a surface thereof. The transparent substrate 220 may be formed of a substrate having transparency because the transparent substrate 220 is provided on a surface from which light is emitted as will be described later. A red (R) color filter 218 may be disposed in a region corresponding to the sub-pixel 11R, a green (R) color filter 218 may be disposed in a region corresponding to the sub-pixel 11G, a blue (B) color filter 218 may be disposed in a region corresponding to the sub-pixel 11B, and a white (W) color filter 218 may be disposed in a region corresponding to the sub-pixel 11W.

FIG. 4A schematically illustrates a structure of the pixel Pix, and FIG. 4B schematically illustrates a sectional structure of the pixel Pix. Thus, in the pixel Pix, yellow light emitted from the yellow light emitting layer 214 and blue light emitted from the blue light emitting layer 215 may be mixed to become white light, and the white light may travel in a direction opposite to the transparent substrate 200 serving as the support substrate. In other words, the light emitting element 30 may be a so-called top-emission light emitting element. The white light may be then outputted from a display surface through the color filter 218. More specifically, in the sub-pixels 11R, 11G, and 11B, a red component, a green component, and a blue component may be separated from the white light and outputted by the color filters 218 of red (R), green (G), and blue (B), respectively. Further, in the sub-pixel 11W, color gamut of the white light may be adjusted by the white (W) color filter 218. Moreover, for example, in an application in which desired image quality (color gamut) is not so high, the white (W) color filter 218 may not be provided.

Further, in this example, the yellow light emitting layer 214 is formed of a material emitting yellow (Y) light; however, the material is not limited thereto. Alternatively, for example, as illustrated in FIG. 4C, the yellow light emitting layer 214 may be configured of a material emitting red (R) light doped with a material emitting green (G) light, or a material emitting green (G) light doped with a material emitting red (R) light. Even in this case, the lamination order of the light emitting layers may be changed.

FIG. 5 illustrates arrangement of the anode 212 in the pixel Pix. In the pixel Pix, four circuit regions 15R, 15G, 15B, and 15W and four anodes 212R, 212G, 212B, and 212W may be provided.

The circuit region 15R may be a region where devices (the write transistor WSTr, the drive transistor DRTr, and the capacitor Cs) other than the light emitting element 30 in the sub-pixel 11R are provided. Likewise, the circuit region 15G may be a region where devices other than the light emitting element 30 in the sub-pixel 11G are provided. The circuit region 15B may be a region where the devices other than the light emitting element 30 in the sub-pixel 11B are provided. The circuit region 15W may be a region where the devices other than the light emitting element 30 in the sub-pixel 11W are provided. In each of the circuit regions 15R, 15G, 15B, and 15W, the write transistor WSTr, the drive transistor DRTr, and the capacitor Cs may be arranged in the same layout. Diverting the same layout in such a way makes it possible to enhance efficiency of layout process.

The anode 212R may be the anode 212 of the sub-pixel 11R, the anode 212G may be the anode 212 of the sub-pixel 11G, the anode 212B may be the anode 212 of the sub-pixel 11B, and the anode 212W may be the anode 212 of the sub-pixel 11W. The anodes 212R, 212G, 212B, and 212W may be respectively coupled to the sources of the drive transistors DRTr formed in the circuit regions 15R, 15G, 15B, and 15W through the contact 205.

FIG. 6 illustrates a configuration example of the drive transistor DRTr. The polysilicon 203 of the drive transistor DRTr may be so formed as to be overlapped with the gate 201 three times by being folded in a region where the gate 201 is not provided. A folded portion W1 of the polysilicon 203 may be injected with ions in manufacturing and may thus be low in resistance. In other words, the portion, of the polysilicon 203, overlapped with the gate 201 may function as an effective channel CH. Accordingly, three channels CH coupled in series may be juxtaposed in a direction intersecting the extending direction of the channels CH in the drive transistor DRTr. Also, as will be described later, in the display device 1, all of the drive transistors DRTr in the display section 10 may be provided to allow the channels CH to extend in the same direction. Such a configuration makes it possible to effectively utilize limited space to configure the drive transistor DRTr with long channel length L, thereby enhancing image quality as will be described later.

As illustrated in FIG. 1, the drive section 20 may drive the display section 10, based on a picture signal Sdisp and a synchronization signal Ssync that are supplied from outside. The drive section 20 may include the picture signal processing section 21, the timing generation section 22, the scan line drive section 23, the power line drive section 26, and the data line drive section 27.

The picture signal processing section 21 may perform predetermined signal processing on the picture signal Sdisp supplied from the outside to generate a picture signal Sdisp2. Examples of the predetermined signal processing may include gamma correction and overdrive correction.

The timing generation section 22 may be a circuit that supplies a control signal to each of the scan line drive section 23, the power line drive section 26, and the data line drive section 27, based on the synchronization signal Ssync supplied from the outside, to control these sections to operate in synchronization with one another.

The scan line drive section 23 may sequentially apply a scan signal WS to the plurality of scan lines WSL according to the control signal supplied from the timing generation section 22, to sequentially select the sub-pixels 11.

The power line drive section 26 may sequentially apply a power signal DS to the plurality of power lines PL according to the control signal supplied from the timing generation section 22, to control light emission operation and light extinction operation of the sub-pixels 11. The power signal DS may transit between a voltage Vccp and a voltage Vini. As will be described later, the voltage Vini may be a voltage to initialize the sub-pixels 11, and the voltage Vccp may be a voltage to allow a current Ids to flow through the drive transistor DRTr, thereby causing the light emitting element 30 to emit light.

The data line drive section 27 may generate a signal Sig according to the picture signal Sdisp2 supplied from the picture signal processing section 21 and the control signal supplied from the timing generation section 22, and may apply the signal Sig to each of the data lines DTL. The signal Sig may include a pixel voltage Vsig that instructs emission luminance of each sub-pixel 11.

As will be described later, this configuration allows the drive section 20 to write the pixel voltage Vsig in each of the sub-pixels 11 and allows the light emitting element 30 to emit light with luminance corresponding to the written pixel voltage Vsig, during one horizontal period.

Here, the channel CH corresponds to a specific but non-limiting example of "channel section" in the disclosure. The folded portion W1 corresponds to a specific but non-limiting example of "coupling section" in the disclosure.

[Operation and Action]

Next, operation and action of the display device 1 according to the present embodiment is described.

(Overall Operation Outline)

First, with reference to FIG. 1, overall operation outline of the display device 1 is described. The picture signal processing section 21 may perform the predetermined signal processing on the picture signal Sdisp supplied from the outside to generate the picture signal Sdisp2. The timing generation section 22 may supply the control signal to each of the scan line drive section 23, the power line drive section 26, and the data line drive section 27, based on the synchronization signal Ssync supplied from the outside, to control these sections to operate in synchronization with one another. The scan line drive section 23 may sequentially apply the scan signal WS to the plurality of scan lines WSL according to the control signal supplied from the timing generation section 22 to sequentially select the sub-pixels 11. The power line drive section 26 may sequentially apply the power signal DS to the plurality of power lines PL according to the control signal supplied from the timing generation section 22, to control light emission operation and light extinction operation of the sub-pixels 11. The data line drive section 27 may generate the signal Sig including the pixel voltage Vsig that corresponds to luminance of each of the sub-pixels 11 according to the picture signal Sdisp2 supplied from the picture signal processing section 21 and the control signal supplied from the timing generation section 22, and may apply the signal Sig to each of the data lines DTL. The display section 10 may perform display operation based on the scan signal WS, the power signal DS, and the signal Sig that are supplied from the drive section 20.

(Detailed Operation)

Next, detailed operation of the display device 1 is described.

FIG. 7 is a timing chart indicating the display operation of the display device 1, where (A) illustrates a waveform of the scan signal WS, (B) illustrates a waveform of the power signal DS, (C) illustrates a waveform of the signal Sig, (D) illustrates a waveform of a gate voltage Vg of the drive transistor DRTr, and (E) illustrates a waveform of a source voltage Vs of the drive transistor DRTr.

The drive section 20 writes the pixel voltage Vsig in each of the sub-pixels 11 during one horizontal period (1H) (writing period P1). Thereafter, the light emitting element 30 of each of the sub-pixels 11 emits light with luminance corresponding to the written pixel voltage Vsig (emission period P2). The detail thereof is described below.

First, the drive section 20 writes the pixel voltage Vsig in each of the sub-pixels 11 during a period from timing t1 to timing t2 (the wiring period P1). More specifically, first, the data line drive section 27 sets the signal Sig to the pixel voltage Vsig at timing t1 ((C) of FIG. 7), and the scan line drive section 23 changes the voltage of the scan signal WS from low level to high level ((A) of FIG. 7). This puts the write transistor WSTr into ON state, and the gate voltage Vg of the drive transistor DRTr is accordingly set to the voltage Vsig ((D) of FIG. 7). Further, at the same time, the power line drive section 26 changes the power signal DS from the voltage Vccp to the the voltage Vini ((B) of FIG. 7). This puts the drive transistor DRTr into ON state, and the source voltage Vs of the drive transistor DRTr is set to the voltage Vini ((E) of FIG. 7).

Then, the scan line drive section 23 changes the voltage of the scan signal WS from high level to low level at timing t2 ((A) of FIG. 7). This puts the write transistor WSTr into OFF state, and the gate of the drive transistor DRTr becomes floating. Thereafter, an inter-terminal voltage of the capacitor Cs, namely, the gate-source voltage Vgs of the drive transistor DRTr is maintained.

Next, the drive section 20 causes the sub-pixels 11 to emit light during a period subsequent to timing t3 (the emission period P2). More specifically, at timing t3, the power line drive section 26 changes the power signal DS from the voltage *Vini* to the voltage Vccp ((B) of FIG. 7). This enables the current Ids to flow through the drive transistor DRTr, and the source voltage Vs of the drive transistor DRTr is accordingly increased ((E) of FIG. 7). Along with the increase of the source voltage Vs, the gate voltage Vg of the drive transistor DRTr is also increased ((D) of FIG. 7). Then, when the source voltage Vs of the drive transistor DRTr becomes larger than a sum (Vel+Vcath) of the threshold voltage Vel of the light emitting element 30 and the voltage Vcath, a current flows between the anode and the cathode of the light emitting element 30, which results in light emission of the light emitting element 30. In other words, the source voltage Vs is increased by the amount corresponding to element variation of the light emitting element 30, and the light emitting element 30 emits light.

Thereafter, in the display device 1, the period shifts from the emission period P2 to the writing period P1 after the predetermined period (one frame period) is elapsed. The drive section 20 performs driving to repeat the series of operation.

(Image Quality)

Next, the image quality of the display device 1 is described. The data line drive section 27 may generate the signal Sig including the pixel voltage Vsig that instructs emission luminance of each sub-pixel 11 according to the picture signal Sdisp2 or any other signals, to apply the signal Sig to each of the data lines DTL. At this time, the pixel voltage Vsig may be varied for each data line DTL due to characteristic variation of the element in manufacturing the display device 1. Even in this case, as illustrated in FIG. 7, in the display device 1, the drive transistor DRTr is configured by coupling the plurality of channels CH in series, which makes it possible to reduce the risk of degradation in image quality. The detail thereof is described below.

As illustrated in FIG. 7, in the sub-pixel 11, the gate voltage Vg of the drive transistor DRTr may be set to the pixel voltage Vsig and the source voltage Vs may be set to the predetermined voltage Vini during the writing period P1. Then, the gate-source voltage Vgs (=Vsig−Vini) at this time may be maintained during the emission period P2, and the drive transistor DRTr may allow the drain current Ids corresponding to the gate-source voltage Vgs to flow through the light emitting element 30 during the emission period P2. At this occasion, the drive transistor DRTr may operate in a so-called saturated region. The drain current Ids of the drive transistor DRTr in the saturated region may be generally represented by the following expression.

$$Ids = \frac{1}{2}\frac{W}{L}Cox \cdot \mu(Vgs - Vth)^2 \qquad \text{[Expression 1]}$$

where W is a channel width, L is a channel length, Cox is a gate insulating film capacity per unit area, μ is a mobility, and Vth is a threshold. The light emitting element 30 may then emit light with luminance corresponding to the drain current Ids.

Therefore, when the pixel voltage Vsig is varied for each data line DTL, the drain current Ids may be varied, and the luminance of the sub-pixel 11 may be varied for each column of the sub-pixels 11. This may cause, for example, in the display image, a stripe extending in the column direction of the sub-pixels 11, which may result in degradation in image quality.

In the display device 1, since the plurality of channels CH are coupled in series to configure the drive transistor DRTr, it is possible to effectively utilize limited space to achieve the drive transistor DRTr with long channel length L. This allows for reduction of risk of degradation in image quality. In other words, for example, in the case where the drive transistor DRTr is configured of one channel CH, it is difficult to achieve the drive transistor DRTr with long channel length L because the channel length of the drive transistor DRTr is restricted by the area of the circuit regions 15R, 15G, 15B, and 15W. In particular, in the case where the drive transistor DRTr and the various lines such as the data lines DTL, the scan lines WSL, and the power lines PL are formed in the same layer, the channel length of the drive transistor DRTr is further restricted by these lines, which results in short channel length L. In contrast, in the display device 1 according to the present embodiment, since the drive transistor DRTr is configured by coupling the plurality of channels CH in series, it is possible to effectively utilize limited space to achieve the drive transistor DRTr with long channel length L. This makes it possible to lower sensitivity of the gate-source voltage Vgs with respect to the drain current Ids in the drive transistor DRTr, as illustrated in the expression (1). Accordingly, it is possible to suppress variation in the drain current Ids even if the pixel voltage Vsig is varied for each data line DTL, which makes it possible to suppress variation of the luminance of the sub-pixels 11 for each column. As a result, it is possible to reduce the risk that a stripe extending in the column direction of the sub-pixels 11 occurs, for example, in the display image, which makes it possible to reduce the risk of degradation in image quality.

Also, since the channel length L of the drive transistor DRTr is made long in this way, it is possible to suppress characteristic variation of the drive transistor DRTr itself. This makes it possible to suppress degradation in image quality caused by the characteristic variation.

Further, in the display device 1, all of the drive transistors DRTr in the display section 10 are provided to allow the channels CH to extend in the same direction as one another. This makes it possible to suppress the characteristic variation (variation in characteristics such as the threshold voltage Vth and the mobility μ) of the drive transistor DRTr. It is accordingly possible to reduce the risk of degradation in image quality. The detail thereof is described below.

The characteristics variation of the drive transistor DRTr may be largely influenced by, for example, a step of forming the polysilicon 203 in the process of forming the transistor. In this step, first, an amorphous silicon layer may be formed on the insulating layer 202 (FIG. 3). Then, annealing treatment may be performed on the amorphous silicon layer by an excimer laser anneal (ELA) apparatus to form the polysilicon 203. Then, ions may be implanted into the channels CH of the polysilicon 203 and lightly doped drain (LDD) in the vicinity of the channels CH by an ion implantation apparatus. Further, ions may be implanted into the vicinity of the contact 205 in the polysilicon 203 by an ion doping apparatus. At this occasion, the treatment by the ELA apparatus may influence the characteristic variation of the drive transistor DRTr.

FIG. 8 schematically illustrates the treatment by the ELA apparatus. FIG. 8 illustrates a case where a plurality of display sections 10 are formed on a large glass substrate 99. As illustrated in FIG. 8, the ELA apparatus may perform annealing treatment on the entire surface of the glass substrate 99 by scanning the glass substrate 99 in a scanning direction D1 while turning on or off a strip-shaped laser beam (beam LB1) at, for example, about several hundred Hz. More specifically, in the scanning, the ELA apparatus may shift a position of a shot of the strip-shaped beam LB1 to allow the strip-shaped beam LB1 in a certain shot to be partially overlapped with the strip-shaped beam LB1 in previous shot. At this time, the energy E of the laser beam may be varied for each shot, which may cause mutual difference between uniformity of the energy E in the same direction as the scanning direction D1 and uniformity of the energy E in the direction intersecting the scanning direction D1. As a result, there is risk that characteristics of the drive transistor in which the channels CH extend in the same direction as the scanning direction D1 is different from the characteristics of the drive transistor in which the channels CH extend in the direction intersecting the scanning direction D1.

FIGS. 9A and 9B each illustrate relationship between arrangement of the drive transistors DRTr in the respective sub-pixels 11 and the scanning direction D1. In the configuration of FIG. 9A, the channels CH of the drive transistors DRTr may be so provided as to extend in the direction orthogonal to the scanning direction D1. In the configuration of FIG. 9B, the channels CH of the drive transistors DRTr may be so provided as to extend in the same direction as the scanning direction D1. In this way, in the display section 10, all of the drive transistors DRTr in the display section 10 may be provided to allow the channels CH to extend in the same direction. In other words, drive transistors DRTr different in the extending direction of the channel CH do not coexist in the display section 10. This makes it possible to suppress, in the display device 1, characteristics variation between the drive transistors DRTr and to reduce the risk of degradation in image quality due to the characteristics variation of the drive transistor DRTr.

As illustrated in FIGS. 9A and 9B, in this example, the channels CH of the drive transistors DRTr extend in the direction orthogonal to the scanning direction D1 (FIG. 9A) or in the same direction as the scanning direction D1; however, the direction is not limited thereto. Alternatively, the channels CH of the drive transistors DRTr may be oriented to any other direction. The direction of the channels CH may be determined in consideration of, for example, image quality.

Further, in the display device 1, the polysilicon 203 of the drive transistor DRTr is folded in the region where the gate 201 is not provided, which makes it possible to suppress characteristic variation of the drive transistor DRTr and to reduce the risk of degradation in image quality. More specifically, in manufacturing process, in addition to the channels CH, the folded portion W1 (FIG. 7) may be also subjected to annealing treatment by the ELA apparatus. Accordingly, the polysilicon 203 of the drive transistor DRTr may include both a portion extending in the direction intersecting the scanning direction D1 and a portion extending in the same direction as the scanning direction D1. The folded portion W1, however, may be low in resistance due to ion implantation and may not function as the channel CH. Therefore, the folded portion W1 less influences the characteristics of the drive transistor DRTr. As a result, in the display device 1, it is possible to suppress the characteristic variation of the drive transistor DRTr caused by the folded portion W1, and to reduce the risk of degradation in image quality caused by the characteristic variation of the drive transistor DRTr.

[Effects]

As described above, in the present embodiment, the plurality of channels are coupled in series to configure the drive transistor, which makes it possible to effectively utilize limited space to achieve the drive transistor with long channel length. This allows for reduction of risk of degradation in image quality.

Also, in the above-described embodiment, the polysilicon of the drive transistor is folded in the region where the gate is not provided, which makes it possible to suppress characteristic variation of the drive transistor. This allows for reduction of risk of degradation in image quality.

Further, in the above-described embodiment, all of the drive transistors in the display section are provided to allow the channels thereof to extend in the same direction, which makes it possible to suppress characteristic variation of the drive transistor. This allows for reduction of risk of degradation in image quality.

[Modification 1-1]

In the above-described embodiment, three channels CH are coupled in series; however the number of channels is not limited thereto. Alternatively, two or four or more channels CH may be coupled in series. FIG. 10 illustrates an example of a case where two channels CH are coupled in series to each other. Also in this case, effects similar to those in the above-described embodiment are obtainable.

[Modification 1-2]

In the above-described embodiment, as illustrated in FIG. 9, the channels CH of the drive transistor DRTr extend in a longitudinal direction of FIG. 9; however, the direction is not limited thereto. For example, as illustrated in FIG. 11, the channels CH of the drive transistor DRTr may extend in a horizontal direction of the figure.

[Modification 1-3]

In the above-described embodiment, the plurality of channels CH coupled in series are juxtaposed in the same layer to configure the drive transistor DRTr; however, the configuration is not limited thereto. Alternatively, the plurality of channels CH may be provided in the lamination direction to configure the drive transistor DRTr. The present modification is described in detail below by taking some specific examples.

FIG. 12A illustrates a schematic sectional structure of a drive transistor DRTrA according to the present modification. The drive transistor DRTrA may include gates 301 and 305 and polysilicons 303 and 307. The gate 301 may be selectively formed on the transparent substrate 200. The insulating layer 302 may be provided on the transparent substrate 200 and the gate 301, and the polysilicon 303 may be selectively formed on the insulating layer 302. The insulating layer 304 may be provided on the insulating layer 202 and the polysilicon 303, and the gate 305 may be selectively formed on the insulating layer 304. The insulating layer 306 may be provided on the insulating layer 304 and the gate 305, and the polysilicon 307 may be provided on the insulating layer 306. The insulating layer 308 may be provided on the insulating layer 306 and the polysilicon 307. Further, in FIG. 12A, contacts 309 and 312 may be so provided respectively at a left end and a right end of the polysilicon 303 as to penetrate the insulating layers 304, 306, and 308. Likewise, contacts 310 and 311 may be so provided respectively at a left end and a right end of the polysilicon 307 as to penetrate the insulating layer 308. Further, the contact 309 and the contact 310 may be coupled to each other on the insulating layer 308. The contact 311 may be, for example, a drain terminal of the drive transistor DRTrA, and the contact 312 may be, for example, a source terminal of the drive transistor DRTrA. Although not illustrated, the gates 301 and 305 may be coupled to each other and coupled to a gate terminal.

Thus, the gate 301, the insulating layer 302, and the polysilicon 303 may configure a transistor of a bottom-gate structure. Likewise, the gate 305, the insulating layer 306, and the polysilicon 307 may configure a transistor of a bottom-gate structure. In the drive transistor DRTrA, the two channels CH coupled in series to each other may be provided in the lamination direction in this way.

Further, in FIG. 12A, for example, the thickness of the insulating layer 302 may be different between in the region where the gate 301 is provided and in the region where the gate 302 is not provided; however, the thickness is not limited thereto. For example, similarly to FIG. 3, the thickness of the insulating layer 302 may be substantially uniform.

FIG. 12B illustrates a schematic sectional structure of a drive transistor DRTrB according to the present modification. The drive transistor DRTrB may include gates 321 and 327 and polysilicons 323 and 325. The gate 321 may be selectively formed on the transparent substrate 200. The insulating layer 322 may be provided on the transparent substrate 200 and the gate 321, and the polysilicon 323 may be selectively formed on the insulating layer 322. The insulating layer 324 may be provided on the insulating layer 222 and the polysilicon 323, and the polysilicon 325 may be selectively formed on the insulating layer 324. The insulating layer 326 may be provided on the insulating layer 324 and the polysilicon 325, and the gate 327 may be provided on the insulating layer 326. The insulating layer 328 may be provided on the insulating layer 326 and the gate 327. Further, in FIG. 12B, contacts 329 and 332 may be so provided respectively at a left end and a right end of the polysilicon 323 as to penetrate the insulating layers 324, 326, and 328. Likewise, contacts 330 and 331 may be so provided respectively at a left end and a right end of the polysilicon 325 as to penetrate the insulating layers 326 and 328. Further, the contact 329 and the contact 330 may be coupled to each other on the insulating layer 328. The contact 331 may be, for example, a drain terminal of the drive transistor DRTrB, and the contact 332 may be, for example, a source terminal of the drive transistor DRTrB. Although not illustrated, the gates 321 and 327 may be coupled to each other and coupled to a gate terminal.

Thus, the gate 321, the insulating layer 322, and the polysilicon 323 may configure a transistor of a bottom-gate structure, and the gate 327, the insulating layer 326, and the polysilicon 325 may configure a transistor of a top-gate structure. In the drive transistor DRTrB, two channels CH coupled in series to each other may be provided in the lamination direction in this way.

In the drive transistor DRTrB, the gate 321, the polysilicon 323, the polysilicon 325, and the gate 327 are provided in this order, which makes it possible to achieve simple operation. Specifically, in the drive transistor DRTrA according to the above-described modification, since the gate 301, the polysilicon 303, the gate 305, and the polysilicon 307 are provided in this order, the voltage of the gate 305 may control generation of an inversion layer of the polysilicon 303 in addition to generation of an inversion layer of the polysilicon 307. In this case, operation of the drive transistor DRTrA may become complicated. In contrast, in the drive transistor DRTrB, since the gates 321 and 327 are provided outside the polysilicons 323 and 325, respectively, the voltage of the gate 321 controls generation of an inversion layer in the polysilicon 323 and the voltage of the gate 327 controls generation of an inversion layer in the polysilicon 325, which makes it possible to achieve simple operation.

FIG. 12C illustrates a schematic sectional structure of a drive transistor DRTrC according to the present modification. The drive transistor DRTrC may include a gate 344 and polysilicons 342 and 346. The insulating layer 341 may be provided on the transparent substrate 200, and the polysilicon 342 may be selectively formed on the insulating layer 341. The insulating layer 343 may be provided on the insulating layer 341 and the polysilicon 342, and the gate 344 may be selectively formed on the insulating layer 343. The insulating layer 345 may be provided on the insulating layer 243 and the gate 344, and the polysilicon 346 may be selectively formed on the insulating layer 345. The insulating layer 347 may be provided on the insulating layer 345 and the polysilicon 346. Further, in FIG. 12C, contacts 349 and 352 may be so provided respectively at a left end and a right end of the polysilicon 342 as to penetrate the insulating layers 343, 345, and 347. Likewise, contacts 350 and 351 may be so provided respectively at a left end and a right end of the polysilicon 346 as to penetrate the insulating layer 347. Further, the contact 349 and the contact 350 may be coupled to each other on the insulating layer 347. The contact 351 may be, for example, a drain terminal of the drive transistor DRTrC, and the contact 352 may be, for example, a source terminal of the drive transistor DRTrC. Although not illustrated, the gate 344 may be coupled to a gate terminal.

Thus, the gate 344, the insulating layer 343, and the polysilicon 342 may configure a transistor of a top-gate structure, and the gate 344, the insulating layer 345, and the polysilicon 346 may configure a transistor of a bottom-gate structure. At this time, the voltage of the gate 344 may control generation of inversion layers in the respective two polysilicons 342 and 346. In the drive transistor DRTrC, the two channels CH coupled in series to each other may be provided in the lamination direction in this way.

In the drive transistor DRTrC, the polysilicon 342, the gate 344, and the polysilicon 346 may be provided in this order, and the generation of the inversion layers in the respective two polysilicons 342 and 346 may be controlled with use of the voltage of the gate 344. In other words, two gates are provided in each of the drive transistors DRTrA and DRTrB according to the foregoing modifications, whereas only one gate is provided in the drive transistor DRTrC according to the present modification. As a result, unlike the drive transistors DRTrA and DRTrB according to the foregoing modifications, a single step of forming the gate is necessary in manufacturing the drive transistor DRTrC, which makes it possible to simplify the manufacturing process.

[Modification 1-4]

In the above-described embodiment, as illustrated in FIG. 6, four circuit regions 15R, 15G, 15B, and 15W are arranged in two rows and two columns as with the four anodes 212R, 212G, 212B, and 212W; however, the layout is not limited thereto. Alternatively, for example, as illustrated in FIGS. 13 and 14, the four anodes 212R, 212G, 212B, and 212W may be arranged in two rows and two columns and four circuit regions 16R, 16G, 16B, and 16W may be arranged along a single direction. In this example, the circuit regions 16R, 16G, 16B, and 16W may be regions long in the longitudinal direction, and may be disposed side by side in this order in the lateral direction. In each of the circuit regions 16R, 16G, 16B, and 16W, the write transistor WSTr, the drive transistor DRTr, and the capacitor Cs may be arranged in the same layout. More specifically, in this example, the layout in the circuit regions 16R and 16B may be obtained by rotating the layout of the circuit regions 16G and 16W by 180 degrees. The anodes 212R, 212G, 212B, and 212W may be respectively coupled to sources of the drive transistors DRTr provided in the circuit regions 16R, 16G, 16B, and 16W through the contact 205.

As illustrated in FIG. 14, in this example, the polysilicon 203 of the drive transistor DRTr may be so provided as to extend in the longitudinal direction without being folded. In other words, in this example, the circuit regions 16R, 16G, 16B, and 16W are each made long in the longitudinal direction, which makes it possible to provide the drive transistor DRTr with long channel length L without folding the polysilicon 203.

[Modification 1-5]

In the above-described embodiment, the four sub-pixels 11R, 11G, 11B, and 11W are arranged in two rows and two columns; however, the layout is not limited thereto. Alternatively, for example, as illustrated in FIG. 15, the four sub-pixels 11R, 11G, 11B, and 11W may be arranged in a single direction. In this example, the sub-pixels 11R, 11G, 11B, and 11W may be made long in the longitudinal direction, and may be juxtaposed in this order in the lateral direction. In this case, the circuit regions may be arranged in two rows and two columns as illustrated in FIG. 9, or may be arranged in a single direction as illustrated in FIG. 14.

[Modification 1-6]

In the above-described embodiment, the pixel Pix is configured of four sub-pixels 11R, 11G, 11B, and 11B of red (R), green (G), blue (B), and white (W); however, the configuration is not limited thereto. Alternatively, as illustrated in FIGS. 16A and 16B, the pixel Pix may be configured of three sub-pixels 11R, 11G, and 11B of red (R), green (G), and blue (B). Moreover, the configuration of the light emitting layer 230 is not limited thereto, and alternatively, for example, as with a light emitting layer 240 illustrated in FIGS. 17A and 17B, a red light emitting layer, a green light emitting layer, and a blue light emitting layer may be provided in regions respectively corresponding to the color filters 218 of red (R), green (G), and blue (B).

[Modification 1-7]

In the above-described embodiment, the light emitting layer 230 emitting white (W) light is provided; however, the configuration is not limited thereto. Alternatively, for example, as illustrated in FIGS. 18A to 18D, a light emitting layer 250 that includes a yellow light emitting layer emitting yellow (Y) light and a blue light emitting layer emitting blue (B) light may be provided. The present modification is described in detail below.

FIGS. 18A to 18D each schematically illustrate an example in which the pixel Pix is configured using four sub-pixels 11R, 11G, 11B, and 11Y of red (R), green (G), blue (B), and yellow (Y). FIG. 18A illustrates an example in which the four sub-pixels 11R, 11G, 11B, and 11Y are arranged in two rows and two columns. FIG. 18B illustrates an example in which the four sub-pixels 11R, 11G, 11B, and 11Y are arranged in a single direction. FIG. 18C illustrates an example in which the sub-pixels 11R, 11Y, and 11G are arranged in the lateral direction and the sub-pixel 11B is so provided as to be adjacent to all of the sub-pixels 11R, 11Y, and 11G in the longitudinal direction. FIG. 18D illustrates a sectional structure of the pixel Pix in any of the cases of FIGS. 18A to 18C. In this case, as illustrated in FIGS. 18A to 18D, the yellow light emitting layer emitting yellow (Y) light may be provided in a region corresponding to the color filters 218 of red (R), green (G), and yellow (Y), and the blue light emitting layer emitting blue (B) light may be provided in a region corresponding to the blue (B) color filter 218, which makes it possible to configure the light emitting layer 250. As a result, in the sub-pixel 11R, yellow (Y) light may be passed through the red (R) color filter 218, which may result in emission of red (R) light. In the sub-pixel 11G, yellow (Y) light may be passed through the green (G) color filter 218, which may result in emission of green (G) light. In the sub-pixel 11Y, yellow (Y) light may be passed through the yellow (Y) color filter 218, which may result in emission of yellow (Y) light. In the sub-pixel 11B, blue (B) light may be passed through the blue (B) color filter 218, which may result in emission of blue (B) light. Moreover, color filters 218 of yellow (Y) and blue (B) may be omitted.

FIGS. 19A to 19C each schematically illustrate an example in which the pixel Pix is configured using three sub-pixels 11R, 11G, and 11B of red (R), green (G), and blue (B). FIG. 19A illustrates an example in which the sub-pixels 11R, 11G, and 11B are arranged in the lateral direction. FIG. 19B illustrates an example in which the sub-pixels 11R and 11G are arranged in the lateral direction and the sub-pixel 11B is so provided as to be adjacent to both the sub-pixels 11R and 11G in the longitudinal direction. FIG. 19C illustrates a sectional structure of the pixel Pix in any of the cases of FIGS. 19A and 19B. In this case, as illustrated in FIGS. 19A to 19C, the yellow light emitting layer emitting yellow (Y) light may be provided in the region corresponding to the color filters 218 of red (R) and green (G), and the blue light emitting layer emitting blue (B) light may be provided in the region corresponding to the blue (B) color filter 218, which makes it possible to configure the light emitting layer 250. As a result, in the sub-pixel 11R, the yellow (Y) light may be passed through the red (R) color filter 218, which may result in emission of red (R) light. In the sub-pixel 11G, the yellow (Y) light may be passed through the green (G) color filter 218, which may result in emission of green (G) light. In the sub-pixel 11B, the blue (B) light may be passed through the blue (B) color filter 218, which may result in emission of blue (B) light. Moreover, the blue (B) color filter 218 may be omitted.

[Modification 1-8]

The layout of the plurality of channels CH of the drive transistor DRTr is not limited to the layout illustrated in FIG. 6. Alternatively, for example, as illustrated in FIG. 20A, two channels CH may extend in directions different from each other. In this example, the polysilicon 203 may be bent by 90 degrees between the two channels CH to allow the two channels CH to extend in different directions. Also, for example, as illustrated in FIG. 20B, the polysilicon 203 may be bent right by 90 degrees after being bent left by 90 degrees between the two channels CH. Even in such a case, it is possible to effectively utilize limited space to achieve the drive transistor DRTr with long channel length L. This allows for reduction of risk of degradation in image quality.

2. Second Embodiment

Next, a display device 2 according to a second embodiment is described. In the present embodiment, the gate insulating film of the drive transistor may have a thickness larger than that of the gate insulating film of the write transistor. Other configurations may be similar to those in the above-described first embodiment (FIG. 1 and other figures). Moreover, like components as those of the display device 1 according to the first embodiment are denoted by like numerals, and the description thereof is appropriately omitted.

As illustrated in FIG. 1, the display device 2 may include a display section 50. The display section 50 may include the plurality of pixels Pix arranged in a matrix, and the pixels Pix each may include four sub-pixels 11 (11R, 11G, 11B, and 11W), as with the display section 10 according to the first embodiment. Each of the sub-pixels 11 may include a drive transistor DRTr2 and a write transistor WSTr2. The drive transistor DRTr2 and the write transistor WSTr2 each may be a transistor having a top-gate structure. The gate insulating film of the drive transistor DRTr2 may have a thickness larger than that of the gate insulating film of the write transistor WSTr2.

FIG. 21 illustrates schematic sectional structures of the drive transistor DRTr2 and the write transistor WSTr2.

The drive transistor DRTr2 may include a polysilicon 401, insulating layers 402 and 403, and a gate 404. In the drive transistor DRTr2, the polysilicon 401 may be selectively formed on the transparent substrate 200. The insulating layers 402 and 403 may be provided in this order on the transparent substrate 200 and the polysilicon 401, and the gate 404 may be selectively formed on the insulating layer 403. A dielectric constant of the insulating layer 403 may be desirably lower than a dielectric constant of the insulating layer 402. The gate insulating film of the drive transistor DRTr2 may be configured of two insulating layers 402 and 403 in this way.

The write transistor WSTr2 may include a polysilicon 401, an insulating layer 402, and a gate 404. In the write transistor WSTr2, the polysilicon 401 may be selectively formed on the transparent substrate 200. The insulating layer 402 may be provided on the transparent substrate 200 and the polysilicon 401, and the gate 404 may be selectively formed on the insulating layer 402. The gate insulating film of the write transistor WSTr2 may be configured of one insulating layer 402 in this way.

Moreover, in this example, the insulating layer 402 is configured of a single layer; however, the configuration is not limited thereto. Alternatively, the insulating layer 402 may be configured of a plurality of layers. Specifically, for example, the insulating layer 402 may be configured using an upper layer formed of silicon nitride (SiNx) and a lower layer formed of silicon oxide (SiO2). Likewise, the insulating layer 403 is configured of a single layer; however, the configuration is not limited thereto. Alternatively, the insulating layer 403 may be configured of a plurality of layers.

FIG. 22 illustrates an example of steps of manufacturing the drive transistor DRTr2 and the write transistor WSTr2. First, in the drive transistor DRTr2 and the write transistor WSTr2, the polysilicon 401 and the insulating layers 402 and 403 may be formed in this order ((A) of FIG. 22). Then, in the write transistor WSTr2, the insulating layer 403 may be removed by etching ((B) of FIG. 22). Next, in the drive transistor DRTr2 and the write transistor WSTr2, the gate 404 and the insulating layer 405 may be formed ((C) of FIG. 22). Thereafter, the contact 205 may be formed to complete the drive transistor DRTr2 and the write transistor WSTr2 as illustrated in FIG. 21.

As described above, in the display device 2, the gate insulating film of the drive transistor DRTr2 is formed to have a thickness larger than that of the gate insulating film of the write transistor WSTr2, which makes it possible to reduce the gate insulating film capacity Cox of the drive transistor DRTr2. This allows for reduction of risk of degradation in image quality. In other words, in the display device 2, it is possible to reduce the gate insulating film capacity Cox of the drive transistor DRTr. This makes it possible to lower sensitivity of the gate-source voltage Vgs with respect to the drain current Ids, as represented by the expression (1). Therefore, even if the pixel voltage Vsig is varied for each data line DTL, it is possible to reduce the risk that a stripe extending in the column direction of the sub-pixels 11 occurs, for example, in the display image. This allows for reduction of risk of degradation in image quality.

Further, in the display device 2, the insulating layers 402 and 403 are provided in the drive transistor DRTr2 and the write transistor WSTr2, and the insulating layer 403 is then removed from the write transistor WSTr2 by etching. At this occasion, the insulating layer 402 remains in the write transistor WSTr2, which makes it possible to reduce the risk of contamination of the polysilicon 401 of the write transistor WSTr2. Also, the gate 404 is formed in each of the drive transistor DRTr2 and the write transistor WSTr2 after the insulating layer 403 is removed from the write transistor WSTr2, which makes it possible to form the gate 404 of each of the drive transistor DRTr2 and the write transistor WSTr2 at a time. Thus, a single step of forming the gate is necessary, which makes it possible to simplify the manufacturing process.

As described above, in the present embodiment, the gate insulating film of the drive transistor is formed to have a thickness larger than that of the gate insulating film of the write transistor, which makes it possible to reduce the gate insulating film capacity of the drive transistor. This allows for reduction of risk of degradation in image quality.

Further, in the present embodiment, the insulating layers 402 and 403 are formed in each of the drive transistor and the write transistor, and the insulating layer 403 is then removed from the write transistor to allow the gate to be formed in each of the drive transistor and the write transistor. This allows for reduction of risk of contamination of the polysilicon. In addition, a single step of forming the gate is necessary, which makes it possible to simplify the manufacturing process.

[Modification 2-1]

In the above-described embodiment, in the write transistor WSTr2, the insulating layer 403 is removed by etching to form the gate insulating film of the drive transistor WSTr2 to have a thickness larger than that of the gate insulating film of the write transistor WSTr2; however, the configuration is not limited thereto. The present modification is described below by taking some examples.

FIG. 23 illustrates schematic sectional structures of a drive transistor DRTr2A and a write transistor WSTr2A according to the present modification. The drive transistor DRTr2A may include insulating layers 412 and 413. In the drive transistor DRTr2A, the insulating layers 412 and 413 may be provided in this order on the transparent substrate 200 and the polysilicon 401, and the gate 404 may be selectively formed on the insulating layer 413. A dielectric constant of the insulating layer 412 may be desirably lower than that of the insulating layer 413. The gate insulating film of the drive transistor DRTr2A may be configured of the two insulating layers 412 and 413 in this way. The write transistor WSTr2A may include the insulating layer 413. In the write transistor WSTr2A, the insulating layer 413 may be provided on the transparent substrate 200 and the polysilicon 401, and the gate 404 may be selectively formed on the insulating layer 413. The gate insulating film of the write transistor WSTr2A may be configured of one insulating layer 413 in this way.

FIG. 24 illustrates an example of steps of manufacturing the drive transistor DRTr2A and the write transistor WSTr2A. First, in each of the drive transistor DRTr2A and the write transistor WSTr2A, the polysilicon 401 and the insulating layer 412 may be formed in this order ((A) of FIG. 24). Then, the insulating layer 412 may be all removed from the write transistor WSTr2A by etching ((B) of FIG. 24). Subsequently, in each of the drive transistor DRTr2A and the write transistor WSTr2A, the insulating layer 413 may be formed ((C) of FIG. 24), and the gate 404 and the insulating layer 405 may be then formed ((D) of FIG. 24).

Also in this case, it is possible to reduce the gate insulating film capacity Cox of the drive transistor DRTr2A, which makes it possible to reduce the risk of degradation in image quality.

In the steps of manufacturing the drive transistor DRTr2A and the write transistor WSTr2A, as illustrated in FIG. 24, the polysilicon 401 and the insulating layer 412 are formed, and then the insulating layer 412 is all removed from the write transistor WSTr2A by etching. However, the step is not limited thereto, and alternatively, for example, as with a drive transistor DRTr2B and a write transistor WSTr2B illustrated in FIGS. 25 and 26, the polysilicon 401 and the insulating layer 412 may be formed in the drive transistor DRTr2B and the write transistor WSTr2B, and a portion of the insulating layer 412 may be then removed from the write transistor WSTr2B by etching to allow a thin insulating layer 412A to be left. In this example, as illustrated in FIG. 25, the write transistor WSTr2B may include the insulating layers 412A and 413. The insulating layer 412A may be formed at the same time as the insulating layer 412 in the drive transistor DRTr2B. As described above, the gate insulating film of the write transistor WSTr2B may be configured of two insulating layers 412A and 413. A portion of the insulating layer 412 (the insulating layer 412A) is left in such a way, which makes it possible to reduce the risk of contamination of the polysilicon 401 as compared with a case where the insulating layer 412 is all removed.

FIG. 27 illustrates a schematic sectional structure of a drive transistor DRTr2C and a write transistor WSTr2C according to the present modification. The drive transistor DRTr2C may include insulating layers 432 and 434 and a gate 435. In the drive transistor DRTr2C, the insulating layers 432 and 434 may be provided in this order on the transparent substrate 200 and the polysilicon 401, and the gate 435 may be selectively formed on the insulating layer 434. A dielectric constant of the insulating layer 434 may be desirably lower than that of the insulating layer 432. The gate insulating film of the drive transistor DRTr2C may be configured of the two insulating layers 432 and 434 in this way. The write transistor WSTr2C may include the insulating layer 432 and a gate 433. In the write transistor WSTr2C, the insulating layer 432 may be provided on the transparent substrate 200 and the polysilicon 401, and the gate 433 may be selectively formed on the insulating layer 432. The gate insulating film of the write transistor WSTr2C may be configured of one insulating layer 432 in this way.

FIG. 28 illustrates an example of steps of manufacturing the drive transistor DRTr2C and the write transistor WSTr2C. First, in each of the drive transistor DRTr2C and the write transistor WSTr2C, the polysilicon 401 and the insulating layer 432 may be formed in this order ((A) of FIG. 28). Then, the gate 433 may be formed in the write transistor WSTr2C, and the insulating layer 434 may be then formed in each of the drive transistor DRTr2C and the write transistor WSTr2C ((B) of FIG. 28). Subsequently, the gate 435 may be formed in the drive transistor DRTr2C, and the insulating layer 405 may be then formed in each of the drive transistor DRTr2C and the write transistor WSTr2C ((C) of FIG. 28).

Also in this case, it is possible to reduce the gate insulating film capacity Cox of the drive transistor DRTr2C, which makes it possible to reduce the risk of degradation in image quality.

[Modification 2-2]

The drive transistor DRTr2 and the write transistor WSTr2 each having a top-gate structure are used in the above-described embodiment; however, the structure of the transistor is not limited thereto. Alternatively, for example, the drive transistor DRTr2 and the write transistor WSTr2 each having a bottom-gate structure may be used.

[Other Modifications]

Any of the modifications according to the first embodiment described above may apply to the display device 2 according to the above-described embodiment.

3. Third Embodiment

Next, a display device 3 according to a third embodiment is described. In the present embodiment, grains (crystal grains) in the polysilicon of the drive transistor may be made smaller in size than grains of the other transistors. Other configurations may be similar to those in the above-described first embodiment (FIG. 1 and other figures). Moreover, like components as those of the display device 1 according to the first embodiment are denoted by like numerals, and the description thereof is appropriately omitted.

As illustrated in FIG. 1, the display device 3 may include a display section 60. The display section 60 may include the plurality of pixels Pix arranged in a matrix, and each of the pixels Pix may include the four sub-pixels 11 (11R, 11G, 11B, and 11W), as with the display section 10 according to the first embodiment. Each of the sub-pixels 11 may include a drive transistor DRTr3 and a write transistor WSTr3. In this example, grains G (crystal grains) of the polysilicon 203 in the drive transistor DRTr3 may be made smaller in size than grains G of the polysilicon 203 in the write transistor WSTr3.

FIG. 29 illustrates an example of the grains (crystal grains) of the polysilicon 203. In this example, the grains G having random shapes may be disposed at random in the polysilicon 203. Moreover, the grain G is not limited thereto, and alternatively, grains with similar shapes to one another may be orderly arranged. In the step of manufacturing the drive transistor DRTr3 and the write transistor WSTr3, the amorphous silicon layer may be formed on the insulating layer 202 (FIG. 3), and the annealing treatment may be performed on the amorphous silicon layer by the ELA apparatus to allow the grains G to grow, which results in formation of the polysilicon 203, as with the display device 1 according to the above-described first embodiment. At this time, a laser beam may be applied to the drive transistor DRTr3 and the write transistor WSTr3 under different application conditions from each other. Specifically, for example, a laser beam with low energy may be applied to the drive transistor DRTr3, whereas a laser beam with high energy may be applied to the write transistor WSTr3. Moreover, application is not limited thereto, and alternatively, for example, a laser beam with fixed energy may be applied to the drive transistor DRTr3 and the write transistor WSTr3 while the number of times of application to the drive transistor DRTr3 may be decreased to shorten the total application time and the number of times of application to the write transistor WSTr3 may be increased to prolong the total application time. This makes it possible to make the grains G of the drive transistor DRTr3 smaller in size than the grains G of the write transistor WSTr3.

As described above, in the display device 3, the grains G of the drive transistor DRTr3 are thus made smaller in size than the grains G of the write transistor WSTr3, which makes it possible to reduce the risk of degradation in image quality. Specifically, when the grains G are made smaller in size, it is possible to decrease the mobility μ of carrier (for example, electron) in the polysilicon 203. In other words, the carrier is able to move fast in each grain G, but the moving speed is decreased at border between the grains G. Accordingly, as the grains G are made smaller, the number of borders between grains G to be crossed by the carrier is increased, and the mobility μ is thus decreased. Therefore, in the display device 3, the mobility μ of the drive transistor DRTr3 is decreased, which makes it possible to lower sensitivity of the gate-source voltage Vgs with respect to the drain current Ids as represented by the expression (1). This allows for reduction in the possibility that a stripe extending in the column direction of the sub-pixel 11 occurs in the display image even if the pixel voltage Vsig is varied for each data line DTL, which makes it possible to reduce the risk of degradation in image quality.

Further, as mentioned above, the grains G of the polysilicon 203 in the drive transistor DRTr3 are made smaller in size than the grains G of the polysilicon 203 in the write transistor WSTr3, which makes it possible to suppress variation in mobility μ. In other words, the mobility μ may vary depending on the number of borders between the grains G to be crossed by the carrier. Therefore, as the grains G are made smaller in size, the number of borders between the grains G to be crossed by the carrier is increased to reduce variation in the number of borders, which makes it possible to suppress the variation in mobility μ. As a result, it is possible to suppress degradation in image quality caused by variation in mobility μ of the drive transistor DRTr3.

FIG. 30 illustrates an implementation example of the display device 3. In this example, peripheral circuits 71 to 74 may be disposed on left side, upper side, right side, and lower side of the display section 60, respectively. The peripheral circuit 71 may be, for example, the scan line drive section 23, the peripheral circuit 73 may be, for example, the power line drive section 26, and the peripheral circuit 74 may be, for example, the data line drive section 27. As mentioned above, in the display section 60, the grains G of the drive transistor DRTr3 may be made smaller in size than those of the write transistor WSTr3. In the peripheral circuits 71 to 74, for example, the grains G of the transistors used in the respective circuits may be equivalent in size to the grains G of the write transistor WSTr3 in the display section 60. This makes it possible to make the mobility μ of the drive transistor DRTr3 of the display section 60 smaller than the mobility μ of the transistors other than the drive transistor DRTr3. Thus, in the display device 3, the mobility μ of only the drive transistor DRTr3 is made small while the mobility μ of the transistors other than the drive transistor DRTr3 is maintained to a large value, which makes it possible to suppress degradation in image quality while suppressing possibility of influence to the operation of the transistors other than the drive transistor DRTr3.

As described above, in the present embodiment, the grains of the drive transistor are made smaller in size than the grains of the write transistor, which makes it possible to decrease the mobility of the drive transistor. This allows for reduction of risk of degradation in image quality.

[Modification 3-1]

In the above-described embodiment, the mobility μ of the drive transistor DRTr3 of the display section 60 is decreased, and the mobility μ of the write transistor WSTr3 of the display section 60 and the mobility μ of the transistors in the respective peripheral circuits 71 to 74 are increased; however, the mobility μ is not limited thereto. Alternatively, for example, the mobility μ of the drive transistor DRTr3 and the write transistor WSTr3 of the display section 60 may be decreased and the mobility μ of the transistors in the respective peripheral circuits 71 to 74 may be increased. Also, for example, the mobility μ of the drive transistor DRTr3 and the write transistor WSTr3 of the display section 60 and the mobility μ of the transistors in the respective peripheral circuits 71 and 73 may be decreased as well as the mobility μ of the transistors in the respective peripheral circuits 72 and 74 may be increased. Further, for example, the mobility μ of the drive transistor DRTr3 and the write transistor WSTr3 of the display section 60 and the mobility μ of the transistors in the respective peripheral circuits 72 and 74 may be decreased as well as the mobility μ of the transistors in the respective peripheral circuits 71 and 73 may be increased.

[Modification 3-2]

In the above-described embodiment, a laser beam is applied to the drive transistor DRTr3 and the write transistor WSTr3 under the different application conditions from each other to make the grains G of the polysilicon 203 in the drive transistor DRTr3 smaller than the grains G of the polysilicon 203 in the write transistor WSTr3. However, the configuration is not limited thereto. The present modification is described in detail below.

FIG. 31 illustrates schematic sectional structures of a drive transistor DRTr3A and a write transistor WSTr3A according to the present modification. FIG. 32 illustrates a configuration example of the drive transistor DRTr3A. The drive transistor DRTr3A and the write transistor WSTr3A each may have a top-gate structure.

The drive transistor DRTr3A may include an electrically-conductive layer 501, an insulating layer 502, a polysilicon 503, an insulating layer 504, a gate 505, and an insulating layer 506. In the drive transistor DRTr3A, the electrically-conductive layer 501 may be selectively formed on the transparent substrate 200. The electrically-conductive layer 501 may be formed of, for example, molybdenum (Mo). Further, the insulating layer 502 may be provided on the transparent substrate 200 and the electrically-conductive layer 501. The polysilicon 503 may be selectively formed on the insulating layer 502, and the insulating layer 504 may be provided on the insulating layer 502 and the polysilicon 503. Further, the gate 505 may be selectively formed on the insulating layer 504, and the insulating layer 506 may be provided on the insulating layer 504 and the gate 505.

As described above, the electrically-conductive layer 501 may be provided below the polysilicon 503 in the drive transistor DRTr3A. In this example, as illustrated in FIG. 32, the electrically-conductive layer 501 may be provided in a region corresponding to a region where the gate 505 is provided. In other words, the electrically-conductive layer 501 may be provided below the channel CH of the drive transistor DRTr3A. Moreover, the configuration is not limited thereto, and alternatively, for example, the electrically-conductive layer 501 may be provided below at least a portion of the channel CH.

The write transistor WSTr3A may include the insulating layer 502, the polysilicon 503, the insulating layer 504, the gate 505, and the insulating layer 506. In other words, unlike the drive transistor DRTr3A, the write transistor WSTr3A may not include the electrically-conductive layer 501.

In the step of manufacturing the drive transistor DRTr3A and the write transistor WSTr3A, for example, as with the display device 1 according to the first embodiment, an amorphous silicon layer may be formed on the insulating layer 502, and annealing treatment may be performed on the amorphous silicon layer by the ELA apparatus to allow the grains G to grow, which results in formation of the polysilicon 503. At this time, a laser beam may be applied to the drive transistor DRTr3A and the write transistor WSTr3A under the same application condition. Then, in the drive transistor DRTr3A, heat generated in the amorphous silicon layer (the polysilicon 503) may be transferred to the electrically-conductive layer 501 through the insulating layer 502 and dissipated. Accordingly, in the drive transistor DRTr3A, the amorphous silicon layer may be easily heated and cooled as compared with the amorphous silicon layer of the write transistor WSTr not including the electrically-conductive layer 501. In other words, temperature of the amorphous silicon layer of the drive transistor DRTr3A at the time when being irradiated with the laser beam may become lower than temperature of the amorphous silicon layer of the write transistor WSTr at the time when being irradiated with the laser beam under the same application condition. This makes it possible to make the grains G of the drive transistor DRTr3A smaller in size than the grains G of the write transistor WSTr3A.

As described above, in the present modification, the electrically-conductive layer 501 is provided below the polysilicon 503 in the drive transistor DRTr3A, which makes it possible to dissipate heat in the drive transistor DRTr3A as compared with the write transistor WSTr3A. This makes it possible to employ the same application condition at the time when the laser beam is applied to the drive transistor DRTr3A and at the time when the laser beam is applied to the write transistor WSTr3A, which makes it possible to simplify the manufacturing process.

The electrically-conductive layer 501 of each of the sub-pixels 11 may be desirably electrically coupled to the electrically-conductive layer 501 of the other sub-pixel 11. This makes it easier to dissipate heat when the laser beam is applied in the manufacturing process. Moreover, the configuration is not limited thereto, and the electrically-conductive layer 501 of each of the sub-pixels 11 may not be coupled to the electrically-conductive layer 501 of the other sub-pixel 11.

Further, the electrically-conductive layer 501 may be desirably supplied with a predetermined direct-current voltage, for example. Specifically, for example, the electrically-conductive layer 501 may be grounded. This allows for further stabilization of the operation of each sub-pixel 11. Also, for example, a predetermined positive voltage or a predetermined negative voltage may be applied. This allows for adjustment of the threshold Vth of the drive transistor DRTr3A. Moreover, the voltage is not limited thereto, and an alternate-current voltage may be applied to the electrically-conductive layer 501 or the electrically-conductive layer 501 may be electrically floated.

Also, in this example, as illustrated in FIG. 32, the electrically-conductive layer 501 is provided in the region where the channel CH of the drive transistor DRTr3A is provided; however, the configuration is not limited thereto. Alternatively, for example, as with a drive transistor DRTr3B illustrated in FIG. 33, the electrically-conductive layer 501 may be provided in a wider region including the region where the folded portion W1 of the polysilicon 503 is provided and the region where the contact 205 is provided.

[Other Modifications]

Any of the modifications according to the above-described first and second embodiments may be applied to the display device 3 according to the above-described embodiment.

4. Application Examples

Next, application examples of the display device described in any of the embodiments and the modifications described above are described.

FIG. 34 illustrates an appearance of a television to which the display device according to any of the embodiments and the modifications described above is applied. The television may include, for example, a picture display screen section 510 that includes a front panel 511 and a filter glass 512, and the picture display screen section 510 may be configured of the display device according to any of the embodiments and the modifications described above.

The display device according to any of the embodiments and the modifications described above is applicable to electronic apparatuses in various fields, for example, a digital camera, a notebook personal computer, a mobile terminal device such as a mobile phone, a portable game machine, and a video camera. In other words, the display device according to any of the embodiments and the modifications described above is applicable to electronic apparatuses in various fields that display a picture.

Hereinabove, although the technology has been described with reference to some embodiments, modifications, and application examples to electronic apparatuses, the technology is not limited to the embodiments and other examples, and various modifications may be made.

For example, in the above-described embodiments, the sub-pixel 11 is configured using the N-channel MOS drive transistor DRTr and the N-channel MOS write transistor WSTr; however, the transistor is not limited thereto. Alternatively, for example, as illustrated in FIGS. 35 and 36, a sub-pixel 12 may be configured using a P-channel MOS drive transistor DRRrP and a P-channel MOS write transistor WSTrP. The write transistor WSTrP may have a gate coupled to the scan line WSL, a source coupled to the data lien DTL, and a drain coupled to a gate of the drive transistor DRTrP and one end of the capacitor Cs. The drive transistor DRTrP may have the gate coupled to the drain of the write transistor WSTrP and the one end of the capacitor Cs, a drain coupled to the anode of the light emitting element 30, and a source coupled to the other end of the capacitor Cs and the power line PL. As illustrated in FIG. 36, the drive section 20 may write the pixel voltage Vsig in the sub-pixel 12 during a period from timing t11 to timing t12 (a writing period P11). More specifically, first, the power line drive section 26 may supply the voltage Vccp to the source of the drive transistor DRTrP ((D) of FIG. 36). Then, the data line drive section 27 may set the signal Sig to the pixel voltage Vsig at timing t11 ((B) of FIG. 36), and the scan line drive section 23 may change the voltage of the scan signal WS from low level to high level ((A) of FIG. 36). As a result, the write transistor WSTr may be put into ON state, and the gate voltage Vg of the drive transistor DRTr may be set to the voltage Vsig ((C) of FIG. 36). The light emitting element 30 may emit light in this way during a period subsequent to timing t11 (emission period P12).

Also, for example, in the embodiments and other examples described above, the sub-pixel has a so-called "2Tr1C" configuration; however, the configuration is not limited thereto, and other element may be added to configure the sub-pixel. Specifically, for example, as with a sub-pixel 11A illustrated in FIG. 37, a power transistor DSTr controlling supply of the power signal DS to the drive transistor DRTr may be provided to form a so-called "3Tr1C" configuration.

Also, for example, in the embodiments and other examples described above, the so-called top-emission light emitting element 30 is used; however, the light emitting element is not limited thereto. Alternatively, for example, a so-called bottom-emission light emitting element in which light emitted from the light emitting layer 230 travels toward the transparent substrate 200 serving as the support substrate may be used. Moreover, in this case, unlike the top-emission type, the transparent substrate 200 may be formed of a substrate having transparency because the transparent substrate 200 is provided on a surface from which the light is emitted.

Further, for example, in the embodiments and other examples described above, the display device has the organic EL element; however, the display device is not limited thereto. Any other display device may be used as long as the display device includes a current-driven display element.

Moreover, examples of the method of lengthening the channel CH of the drive transistor DRTr may include those illustrated in FIGS. 38A to 38D. In reference examples illustrated in FIGS. 38A and 38B, the polysilicon 203 is folded in the middle of the region where the gate 201 is provided. More specifically, in the drive transistor DRTr (FIG. 7 and FIG. 10) according to the above-described embodiments, the polysilicon 203 is folded in the region where the gate 201 is not provided, whereas in the drive transistor DRTr (FIGS. 38A and 38B) according to this reference example, the polysilicon 203 is folded in the region where the gate 201 is provided. In a reference example illustrated in FIG. 38C, the polysilicon 203 is bent by 90 degrees in the middle of the region where the gate 201 is provided. In a reference example illustrated in FIG. 38D, the polysilicon 203 is bent left by 90 degrees and then bent right by 90 degrees in the middle of the region where the gate 201 is provided.

Moreover, the effects described in the present specification are illustrative and non-limiting. Effects achieved by the technology may be effects other than those described above.

Moreover, the technology may be configured as follows.

(1) A display device including:
a light emitting element; and
a drive transistor including a coupling section and a plurality of channel sections coupled in series through the coupling section, wherein the drive transistor is configured to supply a drive current to the light emitting element.

(2) The display device according to (1), wherein each of the plurality of channel sections extends in a first direction.

(3) The display device according to (2), wherein
the plurality of channel sections are provided in a same layer, and
the coupling section is provided in a same layer as the layer where the plurality of channel sections are provided.

(4) The display device according to (3), wherein the plurality of channel sections are juxtaposed along a second direction.

(5) The display device according to (2), wherein the plurality of channel sections are provided in different layers from one another.

(6) The display device according to (5), wherein
the drive transistor includes a first gate electrode and a second gate electrode,
the plurality of channel sections include a first channel section and a second channel section, and
the first gate electrode, the first channel section, the second gate electrode, and the second channel section are laminated in this order with an insulating layer in between.

(7) The display device according to (5), wherein
the drive transistor includes a first gate electrode and a second gate electrode,
the plurality of channel sections include a first channel section and a second channel section, and
the first gate electrode, the first channel section, the second channel section, and the second gate electrode are laminated in this order with an insulating layer in between.

(8) The display device according to (5), wherein
the drive transistor includes a gate electrode,
the plurality of channel sections include a first channel section and a second channel section, and
the first channel section, the gate electrode, and the second channel section are laminated in this order with an insulating layer in between.

(9) The display device according to any one of (2) to (8), further including a plurality of drive transistors, wherein
each of the channel sections of the plurality of drive transistors extends in the first direction.

(10) The display device according to any one of (1) to (9), further including a write transistor including a gate electrode and a gate insulating film, wherein
the drive transistor includes a gate electrode and a gate insulating film,
the write transistor transfers a pixel voltage to the gate electrode of the drive transistor, and
the gate insulating film of the drive transistor is thicker than the gate insulating film of the write transistor.

(11) The display device according to (10), wherein the gate insulating film of the drive transistor includes a first insulating layer and a second insulating layer provided between the first insulating layer and the gate electrode of the drive transistor.

(12) The display device according to (11), wherein the gate insulating film of the write transistor further includes a third insulating layer formed of a same material as the first insulating layer, on a same layer as the first insulating layer.

(13) The display device according to (12), wherein a dielectric constant of the second insulating layer is smaller than a dielectric constant of the first insulating layer and a dielectric constant of the third insulating layer.

(14) The display device according to (11), wherein the gate insulating film of the write transistor includes a fourth insulating layer formed of a same material as the second insulating layer, on a same layer as the second insulating layer.

(15) The display device according to (14), wherein the gate insulating film of the write transistor further includes a third insulating layer formed of a same material as the first insulating layer, on a same layer as the first insulating layer, wherein the third insulating layer has a thickness smaller than a thickness of the first insulating layer.

(16) The display device according to (14) or (15), wherein a dielectric constant of the first insulating layer is smaller than a dielectric constant of the second insulating layer and a dielectric constant of the fourth insulating layer.

(17) The display device according to any one of (1) to (4), wherein
the plurality of channel sections are formed in a same layer,
the drive transistor includes a gate electrode and an electrically-conductive layer, and
the electrically-conductive layer, the plurality of channel sections, and the gate electrode are laminated in this order on a substrate with an insulating layer in between.

(18) The display device according to (17), further including a plurality of drive transistors, wherein
an electrically-conductive layer of one of the plurality of drive transistors is coupled to an electrically-conductive layer of another of the plurality of drive transistors.

(19) The display device according to (17) or (18), wherein the electrically-conductive layer is supplied with a predetermined direct-current potential.

(20) The display device according to any one of (1) to (19), further including a write transistor including one or a plurality of channel sections each formed of polycrystal, wherein
the plurality of channel sections of the drive transistor are formed of polycrystal, and an average size of crystal grains in each of the channel sections of the drive transistor is smaller than an average size of crystal grains in each of the channel sections of the write transistor.

(21) The display device according to any one of (1) to (19), further including a write transistor including one or a plurality of channel sections each formed of polycrystal, wherein the plurality of channel sections of the drive transistor are formed of polycrystal, and an average size of crystal grains in each of the channel sections of the drive transistor is substantially equal to an average size of crystal grains in each of the channel sections of the write transistor.

(22) The display device according to (20) or (21), further including a drive section including a plurality of transistors, each of the transistors including a channel section formed of polycrystal, wherein the light emitting element, the drive transistor, and the write transistor constitute a unit pixel, and the drive section drives the unit pixel, wherein an average size of crystal grains in each of the channel sections of the drive transistor is smaller than an average size of crystal grains in the channel section of each of the transistors of the drive section.

(23) A method of manufacturing a display device, the method including:

forming a drive transistor and a write transistor, the drive transistor including a coupling section and a plurality of channel sections coupled in series through the coupling section, and the write transistor configured to transfer a pixel voltage to a gate electrode of the drive transistor; and forming a light emitting element supplied with a current by the drive transistor.

(24) The method of manufacturing the display device according to (23), wherein, when forming a gate insulating film of the drive transistor and the write transistor, a first insulating layer and a second insulating layer are formed in this order in a region where the drive transistor and the write transistor are to be formed, and the second insulating layer is removed thereafter from the region where the write transistor is to be formed.

(25) The method of manufacturing the display device according to (23), wherein, when forming a gate insulating film and the gate electrode of the drive transistor and a gate insulating film and a gate electrode of the write transistor, a first insulating layer is formed in a region where the drive transistor and the write transistor are to be formed, the gate electrode is then formed in the region where the write transistor is to be formed, a second insulating layer is then formed in the region where the drive transistor and the write transistor are to be formed, and the gate electrode is then formed in the region where the drive transistor is to be formed.

(26) The method of manufacturing the display device according to (23), wherein, when forming a gate insulating film of the drive transistor and the write transistor, a first insulating layer is formed in a region where the drive transistor and the write transistor are to be formed, a portion or all of the first insulating layer is then removed from the region where the write transistor is to be formed, and a second insulating layer is then formed in each of the region where the drive transistor and the write transistor are to be formed.

(27) The method of manufacturing the display device according to any one of (24) to (26), wherein one or both of the first insulating layer and the second insulating layer comprise a plurality of insulating layers.

(28) An electronic apparatus provided with a display device and a control section configured to control operation of the display device, the display device including:

a light emitting element; and a drive transistor including a coupling section and a plurality of channel sections coupled in series through the coupling section, wherein the drive transistor is configured to supply a drive current to the light emitting element.

It should be understood by those skilled in the art that various modifications, combinations, sub-combinations, and alterations may occur depending on design requirements and other factors insofar as they are within the scope of the appended claims or the equivalents thereof.

The invention claimed is:

1. A display device comprising:
    a plurality of pixels, each of the plurality of pixels including:
        a light emitting element;
        a capacitor;
        a write transistor configured to supply a pixel voltage supplied from a data line to the capacitor, and
        a drive transistor configured to supply a drive current to the light emitting element according to a voltage stored in the capacitor;
    wherein the drive transistor includes:
        a first channel, and
        a first gate electrode;
    wherein, in a region where the drive transistor is disposed, an electrically-conductive layer is arranged on a substrate, a first insulating layer is arranged between the electrically-conductive layer and the first channel, a second insulating layer is arranged between the first channel and at least a portion of the first gate electrode in a stacking direction,
    the first channel comprising a part of a first silicon layer,
    the electrically-conductive layer encompasses, in a plan view, a region that includes a first region including the first gate electrode, a second region including a first contact of the drive transistor and a third region including the first channel; and
    wherein the write transistor includes a second channel that is part of a second silicon layer and the first silicon layer and the second silicon layer are distinct from each other.

2. The display device according to claim 1, wherein the first silicon layer has a recess portion.

3. The display device according to claim 2, wherein the region encompassed by the electrically-conductive layer further includes a fourth region including the recess portion.

4. The display device according to claim 1, wherein the capacitor includes a first electrode electrically connected to the first gate electrode and a second electrode electrically connected to a source electrode of the drive transistor and an anode electrode of the light emitting element.

5. The display device according to claim 1,
    wherein the write transistor further includes a second gate electrode, and
    wherein, in a region where the write transistor is disposed, the first insulating layer is arranged between the substrate and the second channel, the second insulating layer is arranged between the second channel and at least a portion of the second gate electrode in the stacking direction.

6. The display device according to claim 1, wherein, in the region where the write transistor is disposed, the electrically-conductive layer is not arranged on the substrate.

7. The display device according to claim 1, wherein an entire region of the first gate electrode overlaps with the electrically-conductive layer.

8. The display device according to claim 1, wherein an entire region of the first silicon layer overlaps with the electrically-conductive layer.

9. The display device according to claim 1, wherein a first electrically-conductive layer is coupled to a second electrically-conductive layer, the first electrically-conductive layer being the electrically-conductive layer arranged in a first pixel of the plurality of pixels, and the second electrically-conductive layer being the electrically-conductive layer arranged in a second pixel of the plurality of pixels.

10. The display device according to claim 1, wherein the electrically-conductive layer is supplied with a predetermined positive voltage.

11. The display device according to claim 2, wherein the first silicon layer has a plurality of recess portions that includes the recess portion, and
the electrically-conductive layer are arranged to overlap each of the plurality of recess portions.

12. The display device according to claim 11, wherein one of the plurality of recess portions is on one side of the first silicon layer, and another one of the plurality of recess portions is on an opposite side of the first silicon layer in a planer view.

13. The display device according to claim 1, wherein the first contact and a second contact of the drive transistor are electrically connected to the first silicon layer, and
the first channel is arranged within a path between the first contact and the second contact.

14. The display device according to claim 13, wherein the region encompassed by the electrically-conductive layer further includes a fifth region including the second contact.

15. The display device according to claim 13, wherein the second contact is electrically connected to a power supply line.

16. The display device according to claim 1, wherein the first contact is electrically connected to an anode electrode.

17. A display device comprising:
a plurality of pixels, each of the plurality of pixels including:
a light emitting element;
a capacitor;
a write transistor configured to supply a pixel voltage supplied from a data line to the capacitor, and
a drive transistor configured to supply a drive current to the light emitting element according to a voltage stored in the capacitor;
wherein the drive transistor includes:
a first channel, and
a first gate electrode;
wherein, in a region where the drive transistor is disposed, an electrically-conductive layer is arranged on a substrate, a first insulating layer is arranged on the electrically-conductive layer, the first channel is arranged on the first insulating layer, a second insulating layer is arranged on the first channel and at least a portion of the first gate electrode is arranged on the second insulating layer,
the first channel comprising a part of a first silicon layer,
the electrically-conductive layer comprises a region, in plan view, that includes a first region where the first gate electrode is provided, a second region where at least one contact of the drive transistor is provided, and a third region where the first channel is provided, and
wherein the write transistor includes a second channel that is part of a second silicon layer and the first silicon layer and the second silicon layer are distinct from each other.

18. The display device according to claim 17, wherein the first silicon layer has a recess portion.

19. The display device according to claim 18, wherein the region comprised of the electrically-conductive layer further includes a fourth region where the recess portion is provided.

20. The display device according to claim 17, wherein the capacitor includes a first electrode electrically connected to the first gate electrode and a second electrode electrically connected to a source electrode of the drive transistor and an anode electrode of the light emitting element.

21. The display device according to claim 17,
wherein the write transistor further includes a second gate electrode, and
wherein, in a region where the write transistor is disposed, the first insulating layer is arranged on the substrate, the first channel is arranged on the first insulating layer, the second insulating layer is arranged on the first channel and at least a portion of the second gate electrode is arranged on the second insulating layer.

22. The display device according to claim 17, wherein, in the region where the write transistor is disposed, the electrically-conductive layer is not arranged on the substrate.

23. The display device according to claim 17, wherein an entire region of the first gate electrode overlaps with the electrically-conductive layer.

24. The display device according to claim 17, wherein an entire region of the first silicon layer overlaps with the electrically-conductive layer.

25. The display device according to claim 17, wherein a first electrically-conductive layer is coupled to a second electrically-conductive layer, the first electrically-conductive layer being the electrically-conductive layer arranged in a first pixel of the plurality of pixels, and the second electrically-conductive layer being the electrically-conductive layer arranged in a second pixel of the plurality of pixels.

26. The display device according to claim 17, wherein the electrically-conductive layer is supplied with a predetermined positive voltage.

27. The display device according to claim 18, wherein the first silicon layer has a plurality of recess portions that includes the recess portion, and
the electrically-conductive layer are arranged to overlap each of the plurality of recess portions.

28. The display device according to claim 27, wherein one of the plurality of recess portions is on one side of the first silicon layer, and another one of the plurality of recess portions is on an opposite side of the first silicon layer in a planer view.

29. The display device according to claim 17, wherein a first contact and a second contact of the drive transistor are electrically connected to the first silicon layer, and
the first channel is arranged within a path between the first contact and the second contact.

30. The display device according to claim 29, wherein the region comprised of the electrically-conductive layer further includes a fifth region where the second contact is provided.

31. The display device according to claim 29, wherein the second contact is electrically connected to a power supply line.

32. The display device according to claim 17, wherein a first contact of the drive transistor is electrically connected to an anode electrode.

\* \* \* \* \*